United States Patent [19]
Kuhara et al.

[11] Patent Number: 5,869,964
[45] Date of Patent: Feb. 9, 1999

[54] MAGNETIC RESONANCE IMAGING APPARATUS IN WHICH GRADIENT ECHO SIGNALS ARE ACQUIRED AT A TIME DISTANT FROM THE CENTER OF A GRADIENT ECHO

[75] Inventors: Shigehide Kuhara, Kanagawa-ken; Shoichi Kanayama, Saitama-ken, both of Japan

[73] Assignee: Kabushiki Kaisha Toshiba, Kawasaki, Japan

[21] Appl. No.: 780,898

[22] Filed: Jan. 9, 1997

Related U.S. Application Data

[62] Division of Ser. No. 305,589, Sep. 14, 1994, Pat. No. 5,603,319.

[30] Foreign Application Priority Data

Sep. 14, 1993 [JP] Japan ................................. 5-252321
Dec. 27, 1993 [JP] Japan ................................. 5-347047

[51] Int. Cl.⁶ ........................................................ G01V 3/00
[52] U.S. Cl. ............................................. 324/309; 324/307
[58] Field of Search ...................................... 324/300, 306, 324/307, 309, 318; 128/653.2, 653.3; 600/410, 419

[56] References Cited

U.S. PATENT DOCUMENTS

| | | |
|---|---|---|
| 4,165,479 | 8/1979 | Mansfield . |
| 4,851,779 | 7/1989 | DeMeester et al. ..................... 324/312 |
| 4,859,946 | 8/1989 | Kuhara . |
| 5,229,717 | 7/1993 | Hinks ....................................... 324/309 |
| 5,270,654 | 12/1993 | Feinberg et al. . |
| 5,459,400 | 10/1995 | Moonen ................................... 324/309 |

*Primary Examiner*—Louis Arana
*Attorney, Agent, or Firm*—Oblon, Spivak, McClelland, Maier & Neustadt, P.C.

[57] ABSTRACT

A magnetic resonance imaging apparatus capable of obtaining a brain functional image without spending much time and of facillitating to distinguish a vein portion from a cortex portion. The magnetic resonance imaging apparatus includes: a first unit which acquires at least one of data emphasizing a signal from a blood portion in a region of interest in a biological body to be examined and data least affected by inhomogeneity of a static magnetic field; a second unit which acquires data in which a change of magnetic field inhomogeneity ($T_2^*$) in the region of interest is emphasized; and a control unit which executes simultaneously the first acquiring unit and the second acquiring unit during a predetermined pulse sequence after a radio-frequency magnetic field is applied to the biological body.

9 Claims, 30 Drawing Sheets

FIG.13
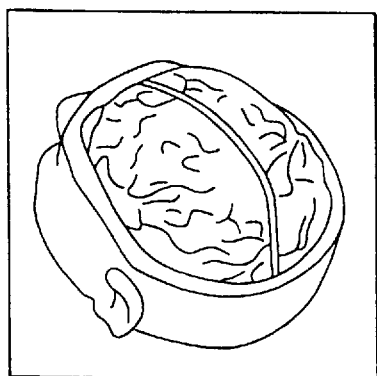
(a)
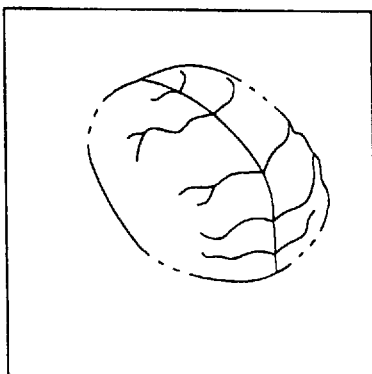
(b)
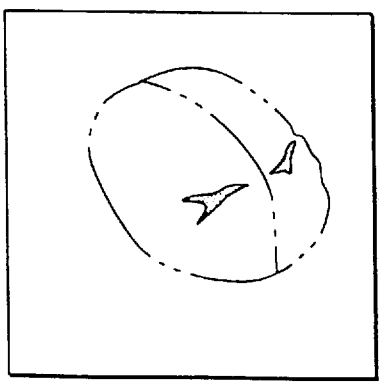
(c)
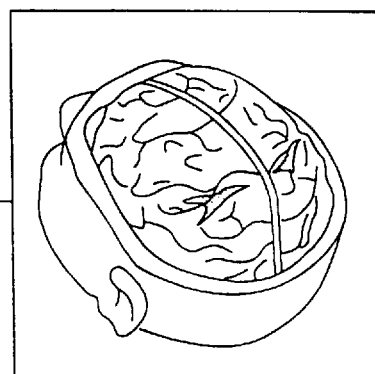
(d)

MAGNETIC RESONANCE IMAGING APPARATUS IN WHICH GRADIENT ECHO SIGNALS ARE ACQUIRED AT A TIME DISTANT FROM THE CENTER OF A GRADIENT ECHO

This is a Division of application Ser. No. 08/305,589 filed on Sep. 14, 1994 now U.S. Pat. No. 5,603,319.

BACKGROUND OF THE INVENTION

1. Technical Field

The present invention relates to a magnetic resonance imaging apparatus by which a specific nucleus density distribution of each tissue in a biological body is measured from outside the biological body without operating or cutting open the biological body, utilizing a magnetic resonance phenomenon.

2. Background Art

Recently, a great deal of the magnetic resonance imaging apparatus have been utilized while a medical diagnostic apparatus has been actively developed.

In a magnetic resonance imaging technique, chemically and physically macroscopic data on a molecule can be obtained by utilizing the fact that a nucleus of an atom absorbs an energy of a radiofrequency field resonantly when an intrinsic spin and its group of each magnetic moment accompanied thereby are placed under a uniform static magnetic field whose intensity is $H_o$. The nucleus resonates, in a plane vertical to the direction of the static magnetic field, with an angular frequency $\omega_o$ shown in the following Larmor equation which is an equation defining the resonance condition including a relationship between the angular frequency $\omega_o$, a gyromagnetic ratio $\gamma$ that is intrinsic to a type of of an atomic nucleus, and the static magnetic field strength $H_o$.

$$\omega_o = \gamma \cdot H_o$$

There are considered methods for imaging a spatial distribution of a specific atomic nucleus (for example, a hydrogen nucleus in water and fat) in the biological body utilizing the magnetic resonance imaging, such as a projection reconstruction method by Lauterbur, a Fourier method by Kumar, Welti and Ernst et al., a spin warp method, that is a modified one over the above mentioned, by Hutchinson et al.

On the other hand, as methods for imaging fluid (e.g. blood) flowing through the biological body, there is available and widely known a method using a flow encode pulse (phase contrast technique) by Moran, a time of flight method utilizing an inflow of nonsaturated fluid to an imaging region, and so on.

More recently, very noticeable is a method which images an increase of a local fresh blood accompanied by activation of a brain. Though the fresh blood contains much hemoglobin oxide that is diamagnetic substance, there is constantly much deoxyhemoglobin in a vein, so that a local magnetic field homogeneity is decreased. When the fresh blood is increased accompanied by the activation of the brain, a density of the hemoglobin oxide is increased so as to improve the local magnetic field homogeneity. A change caused thereby can be captured by obtaining an image where $T_2^*$ ($T_2$ star) is emphasized by an imaging method which is sensitive to the change of the magnetic field homogeneity and in which the echo time is prolonged utilizing a gradient magnetic field echo method such as a field echo method for a long TE and a FID type EPI (echo-planar imaging), so that an activated portion is obtained as a bright area.

By these brain functional imaging methods, activation imaging is possible for a response of vision caused by an optical stimulus and a motion caused by finger movement. For example, by knowing which part of the brain is activated due to the finger movement, a brain cell controlling the finger movement can be specified.

However, recently there is reported a problem where a portion other than a cortex is captured as the bright area. This is because the blood containing a high-density hemoglobin oxide caused by the cortex activation flows into a somehow larger-sized vein existing in a downstream area, so as to cause the magnetic field inhomogeneity. Thereby, it becomes difficult to specify an activated cell.

In order to avoid the above problem, it is suggested that a diffusion of magnetization shall be observed instead of detecting a change of $T_2^*$ which is a transverse relaxation time affected by the magnetic inhomogeneity. However, the change is so little that a S/N ratio is not sufficiently good. Thus, a highly qualified image can not be obtained.

Moreover, another reason why the vein becomes bright is that upon activation of the brain, the flow rate of the vein is changed by some tens of percent, so that such a portion is imaged as the bright area specially in the field echo technique, due to a time-of-flight effect similar to an MR angiography. In order to suppress such an effect, it is considered to make use of a smaller flip angle of a radiofrequency (RF) pulse. However, when the flip angle of the RF pulse is made small, the S/N ratio is deteriorated. The time-of-flight effect can not be completely suppressed, even though there is a drawback where the S/N ratio is deteriorated as mentioned above.

In view of the above drawback, a travel motion of the vein is imaged beforehand by the MR angiography so that distinction between the cortex and the vein is facillitated.

However, in the above conventional technique, it is necessary to take the MR angiography as an extra imaging, so that the imaging duration is further prolonged.

Moreover, in view of $T_2^*$ imaging alone, the conventional $T_2^*$ imaging by a fast spin echo (FSE) method, a hybrid method or the like is considered advantageous in aspects of time resolution and singal-to-noise ratio (SNR). However, in these sequences, the spin echo having no influence of magnetic inhomogeneity in principle is taken as central data at the time reconstructing the image. Thus, it is difficult to achieve sufficiently sensitive $T_2^*$ imaging.

SUMMARY OF THE INVENTION

In view of the foregoing drawbacks, it is therefore an object of the present invention to provide a magnetic resonance imaging apparatus capable of obtaining a brain functional image without spending much time and of facillitating to distinguish a vein portion from a cortex portion.

Another object of the present invention is to provide a magnetic resonance imaging apparatus capable of performing the $T_2^*$ imaging with a sufficient sensitivity even in the event that the fast spin echo (FSE) method or hybrid method is utilized.

According to one aspect of the present invention, there is provided a magnetic resonance imaging apparatus comprising: a first means for acquiring at least one of data emphasizing a signal from a blood portion in a region of interest in a biological body to be examined and data least affected by inhomogeneity of a static magnetic field; a second means for acquiring data in which a change of magnetic field inhomogeneity ($T_2^*$) in the region of interest is emphasized; and a control means for executing simultaneously the first acquiring means and the second acquiring means during a predetermined pulse sequence after a radio-frequency magnetic field is applied to the biological body.

According to another aspect of the present invention there is provided a magnetic resonance imaging apparatus equipped with a sequence generating means therein, for executing a fast spin echo imaging, in which a uniform static magnetic field is applied to a head portion of a biological body, and a radio-frequency magnetic field and a gradient magnetic field are applied thereto in accordance with a predetermined pulse sequence, so that a nuclear magnetic resonance signal from the head portion is detected for obtaining a brain functional image, the apparatus being characterized in that a position of echo data to be used for reconstructing an image is shifted from a center of each spin echo generated by a 180° pulse or an inversion of a gradient magnetic field.

One advantage of the present invention is that the blood vessel image and the brain image are simultaneously obtained without extending an imaging duration, and the cortex portion and the vein portion can be easily distinguished.

Another advantage of the present invention is that since the echo data are acquired in the position shifted by Δt from the central portion of each spin echo generated by applied 180° pulse, the thus acquired echo data reflects $T_2^*$ so that the $T_2^*$-emphasized image can be easily obtained by reconstructing this $T_2^*$-reflected data.

BRIEF DESCRIPTION OF THE DRAWINGS

These and other objects, features and advantages of the present invention will become more apparent from the following description of the preferred embodiment taken in conjunction with the accompanying drawings, in which:

FIG. 1 is prepared to be compared with the third embodiment.

FIG. 3 is prepared to be compared with the third embodiment.

FIG. 7 illustrates a case where the read gradient magnetic field Gr is reversed for plural times, so that multiple echoes are generated.

FIG. 8 illustrates a case where, as shown by the reference numeral 42, the encode step is shifted by a predetermined amount for every excitation, so that a single piece of image is formed by plural shots.

FIG. 9 illustrates a case where, as shown by the reference numeral 52, the encode step of the slice gradient magnetic field is shifted by a predetermined amount for every excitation, so that a three-dimensional image can be obtained.

FIG. 10 illustrates a case of using a spin echo technique for the second data acquisition.

FIG. 11 illustrates a case where there are added encode steps 71 and 72 to the pulse sequence shown in FIG. 19.

FIGS. 13 (a)–(d) show display examples for the brain function images.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

BASIC IDEA and First Embodiment

Figure 5:
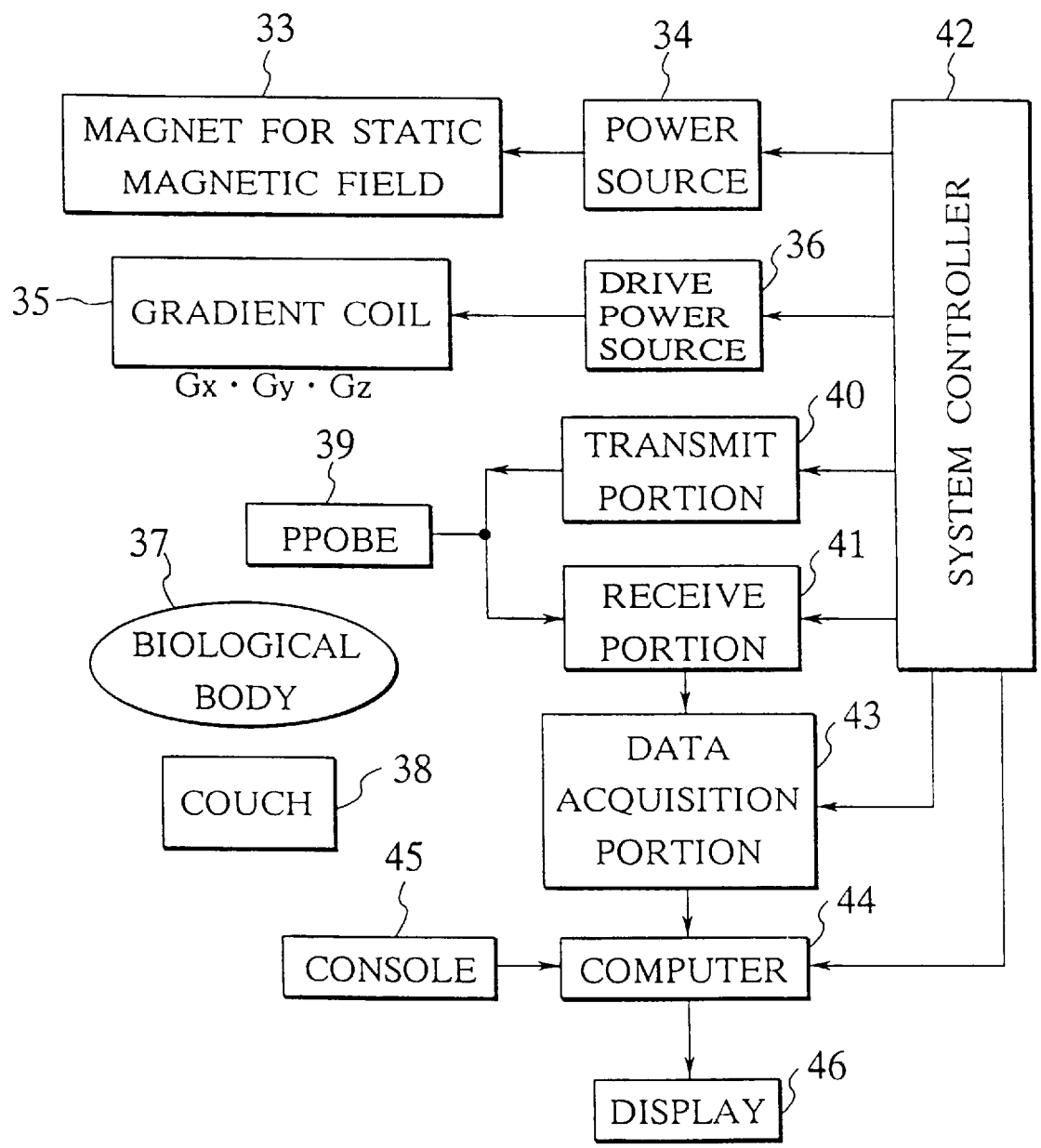
FIG. 5 is a block diagram showing a brief structure for the magnetic resonance imaging apparatus according to the present invention.

FIG. 5 is a block diagram showing a brief structure for the magnetic resonance imaging apparatus according to the present invention.

Referring to FIG. 5, a magnet for static magnetic field 33 and a gradient coil 35 are driven by a power source 34 and a drive source 36, respectively. Thereby, a uniform static magnetic field and a gradient magnetic field having a linearly gradient magnetic field distribution in three directions each of which is orthogonal to one another, are applied to a biological body 37. A high-frequency (radio-frequency) signal is fed to a probe 39 from a transmitter portion 40, so that a radiofrequency (RF) magnetic field is applied to the biological body 37. Here, the probe 39 may be one for use with both transmitting and receiving purpose, or may be ones for use with transmitting and receiving, separately. A magnetic resonance signal received by the probe 39 is orthogonal-phase-detected by a receiver portion 41, and is then transferred to a data acquisition portion 43 so as to be A–D converted, and is thereafter fed to a computer 44.

The power source 34, the drive source 36, the transmitter portion 40, the receiver portion 41 and the data acquisition portion 43 are all controlled by a system controller 42. The system controller is controlled by a console 45 by way of the computer 44. In the computer 44, an image reconstruction process is performed based on the magnetic resonance signal sent from the data acquisition portion 43, so as to obtain image data thereby. The image thus obtained is displayed by a display 46. The computer 44 and the couch 38 are controlled by the console 45.

Next, operation for the present invention will be described. In this first embodiment, data in which a signal from blood vessel portion of the biological body is emphasized, and another data in which the change of $T_2^*$ reflecting the functional information is emphasized, are acquired in a series of sequences.

Figure 6:
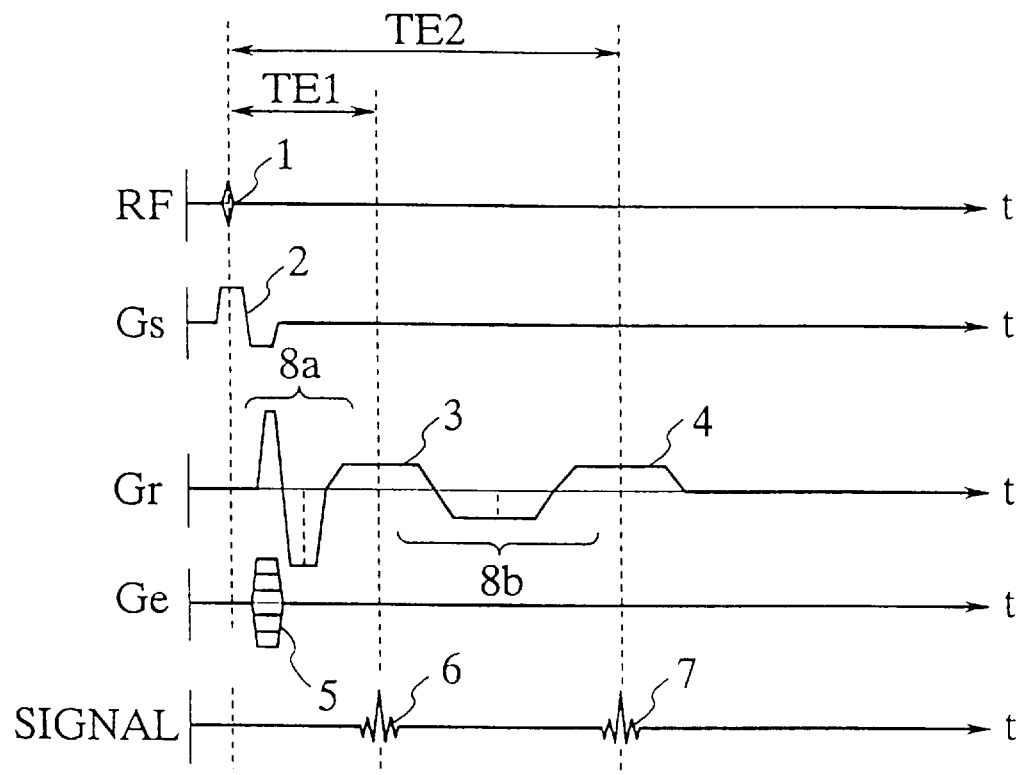
FIG. 6 is a diagram showing an example of pulse sequence where data are acquired by utilizing a field echo method.

FIG. 6 is a diagram showing an example of pulse sequence where data are acquired by utilizing a field echo method. Referring to FIG. 6 showing the first embodiment, utilized are (1) the time-of-flight effect by which data are acquired while the signal from the blood vessel portion in the biological body is emphasized, and (2) the gradient magnetic field echo and long TE technique by which data are acquired in a manner that the change of $T_2^*$ is emphasized.

Referring to FIG. 6, after an RF pulse 1 (having a flip angle of 40°, for example) is applied while a slice gradient magnetic field 2 is being applied, a read gradient magnetic field (flow compensation) 8a obtained after being once reversed is applied. As a result thereof, an echo 6 is obtained which reflects blood vessel image at the time of a read gradient magnetic field 3 being applied (echo time TE1). An encode pulse 5 is applied for the purpose of attaching a phase information to a spin.

Still referring to FIG. 6, thereafter, the gradient magnetic field (indicated with 8a) for use with the flow compensation is applied. Then, the $T_2^*$-emphasized echo is acquired (echo time TE2) at the time of the read gradient magnetic field 4 being applied.

Namely, in order to improve capability of depicting the blood vessel portion by the time-of-flight effect, a short TE1 is used and a next gradient magnetic field waveform 8a for the flow compensation is applied to the read gradient magnetic field 3. In order to suppress the artifact due to pulsation caused by cerebral spinal flow (CSF), the gradient magnetic field 8b for the compensation is also applied to the read gradient magnetic field 4. In order to suppress the misregistration due to the $T_2^*$ effect, the readout gradient magnetic field 4 having the same polarity with the first readout gradient magnetic field 3 is applied to the gradient coil.

As described above, at least two types of data acquisition means are implemented in a series (one view) of operation composed of excitation, phase encode and data acquisition Thereby, both the image for the brain function and the image of the blood vessel are simultaneously obtained, so that the somehow large vein that might be mistaken as the cortex activation portion can be distinguished. Moreover, the imaging duration is not extended. Then, the distinction is further facillitated by superimposing the functional image on the vein image.

In the pulse sequence shown in FIG. 6, it is preferable that the TE2 is selected so as to be a long TE in order to emphasize the change of $T_2^*$. Here, $\Delta S$ which indicates an amount of signal difference in the echo time TE and $T_2^*$ is proportional to a signal intensity exp $(-TE/T_2^*)$, and varies due to the brain activation from $T_2^* \rightarrow (T_2^* + \alpha)$. Then, the following equation (1) holds.

$$\Delta S = C \cdot \{exp(-TE/(T_2^*+\alpha)) - exp(-TE/T_2^*)\} \quad (1)$$

where C is some constant.

In equation (1), when TE=0, ∞, $\Delta S$ becomes zero. When TE is not zero, $\alpha > 0$. Thus, $\Delta S$ has a maximum value with respect to TE. Thus, it is theoretically preferable that the echo time TE at the time $\Delta S$ has the maximum value is regarded as TE2. Normally, if $T_2^*$ in a pixel is approximately one hundred some tens [ms], $\Delta S$ increases along with extension of TE while TE is in a range equal or greater than the $T_2^*$ level. Actually, it is preferable that TE=30–50 [ms] in view of the limitation of imaging duration and image distortion.

In the above first embodiment, two kinds of data are acquired utilizing the field echo technique. The present invention is not limited to this example alone, and other pulse sequences as shown in FIG. 7–FIG. 11 may be utilized.

Figure 7:
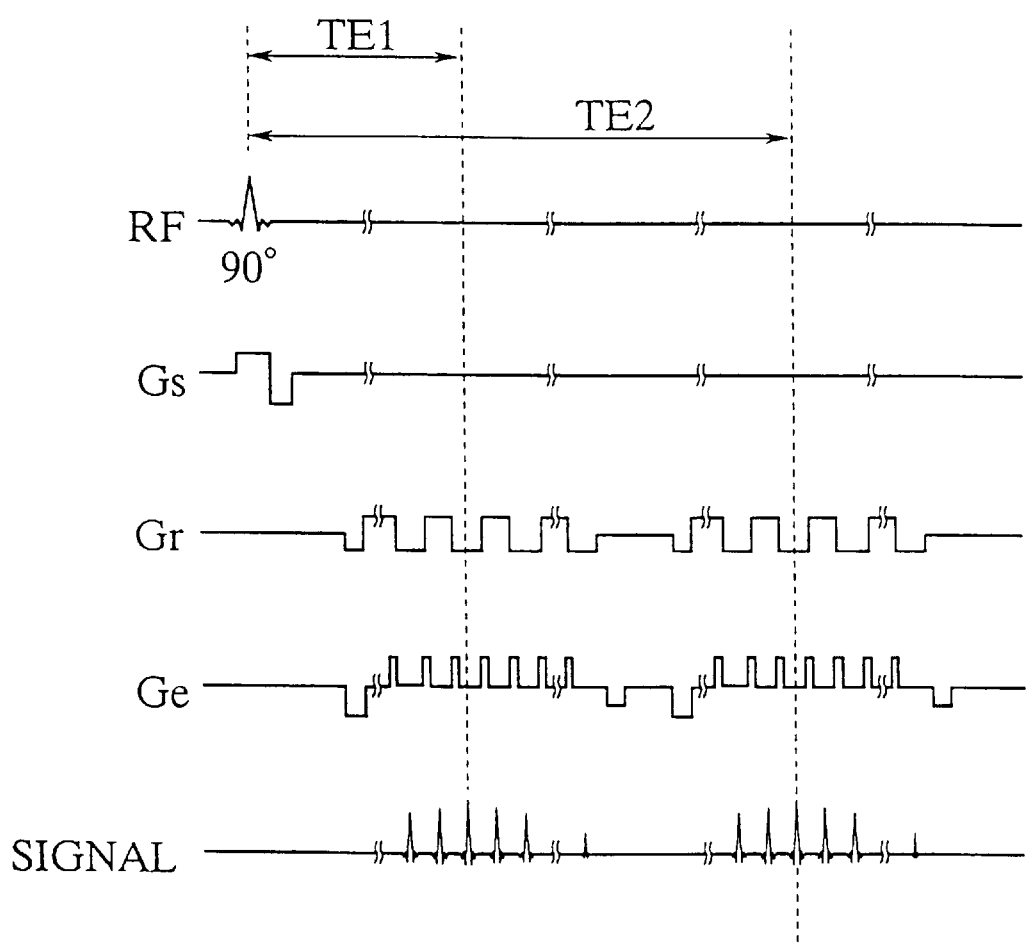
FIGS. 7–11 show variations of pulse sequences based on the first embodiment shown in FIG. 6.

FIG. 7 illustrates a case where the read gradient magnetic field Gr is reversed for plural times, so that multiple echoes are generated.

Figure 8:
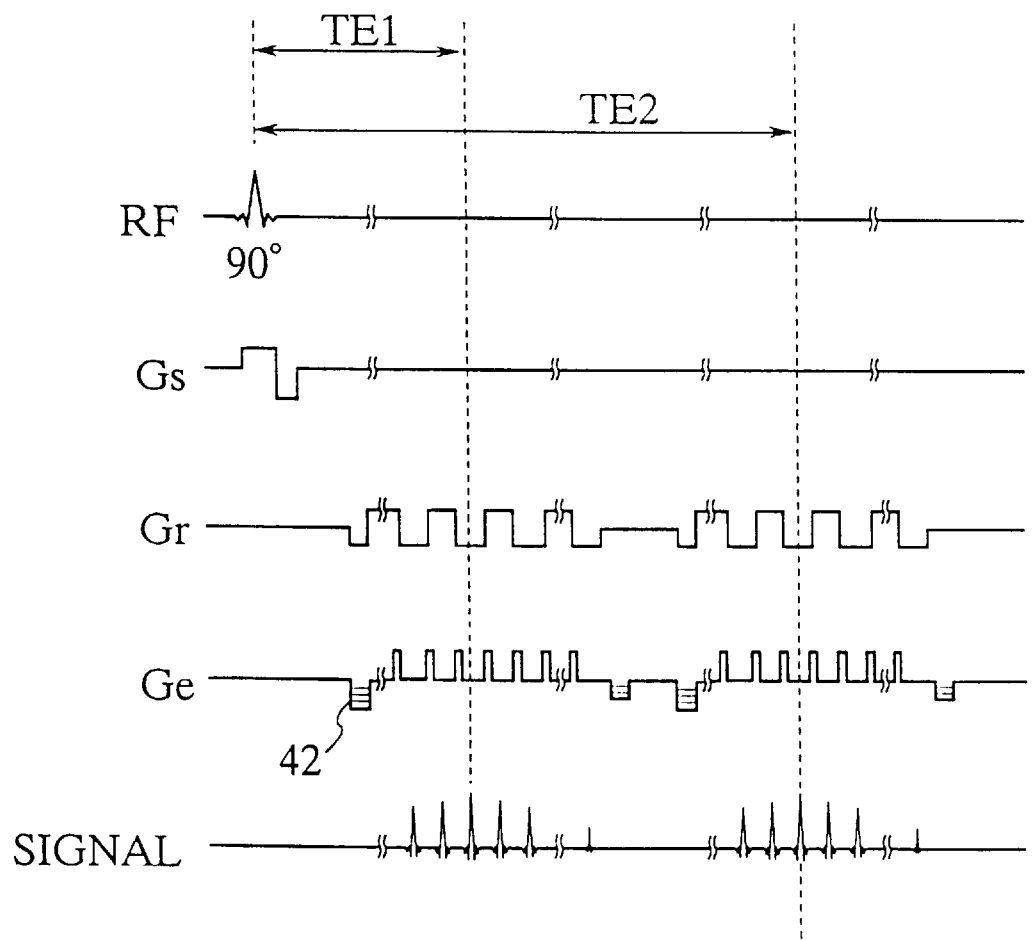

FIG. 8 illustrates a case where, as shown by the reference numeral 42, the encode step is shifted by a predetermined amount for every excitation, so that a single piece of image is formed by plural shots.

Figure 9:
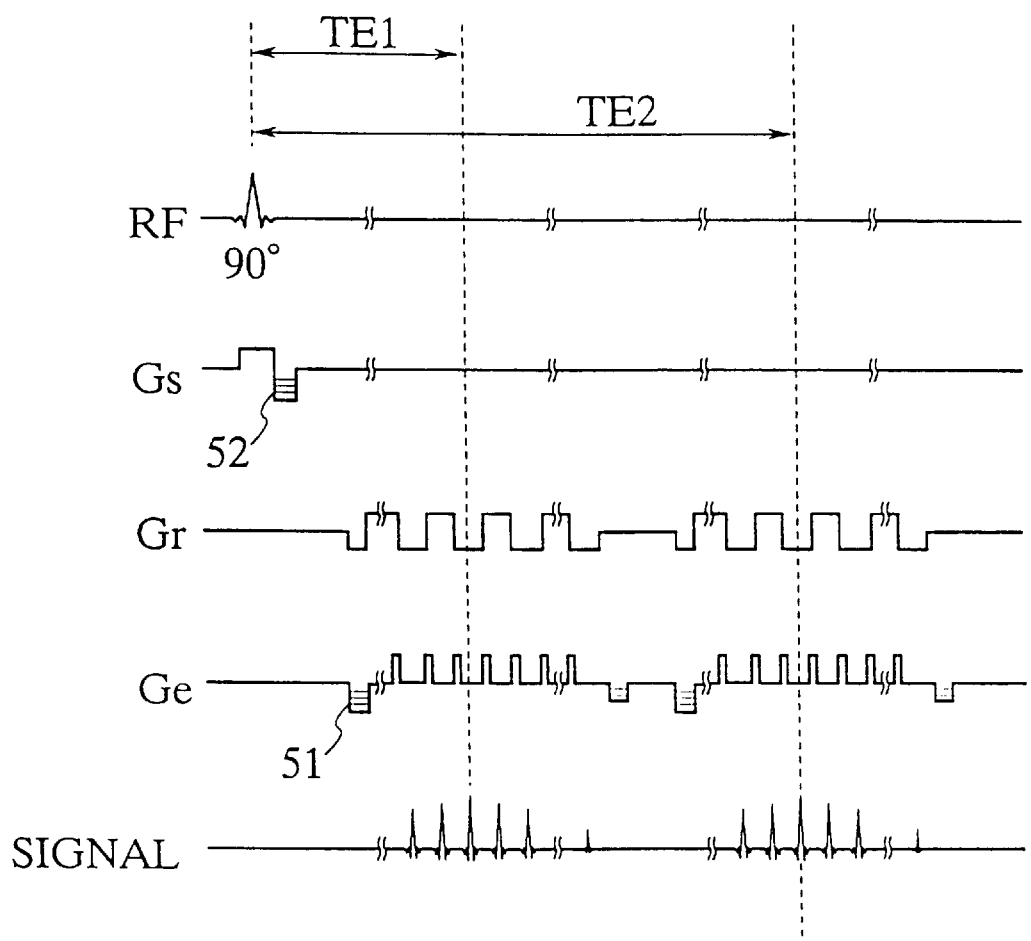

FIG. 9 illustrates a case where, as shown by the reference numeral 52, the encode step of the slice gradient magnetic field is shifted by a predetermined amount for every excitation, so that a three-dimensional image can be obtained.

Figure 10:
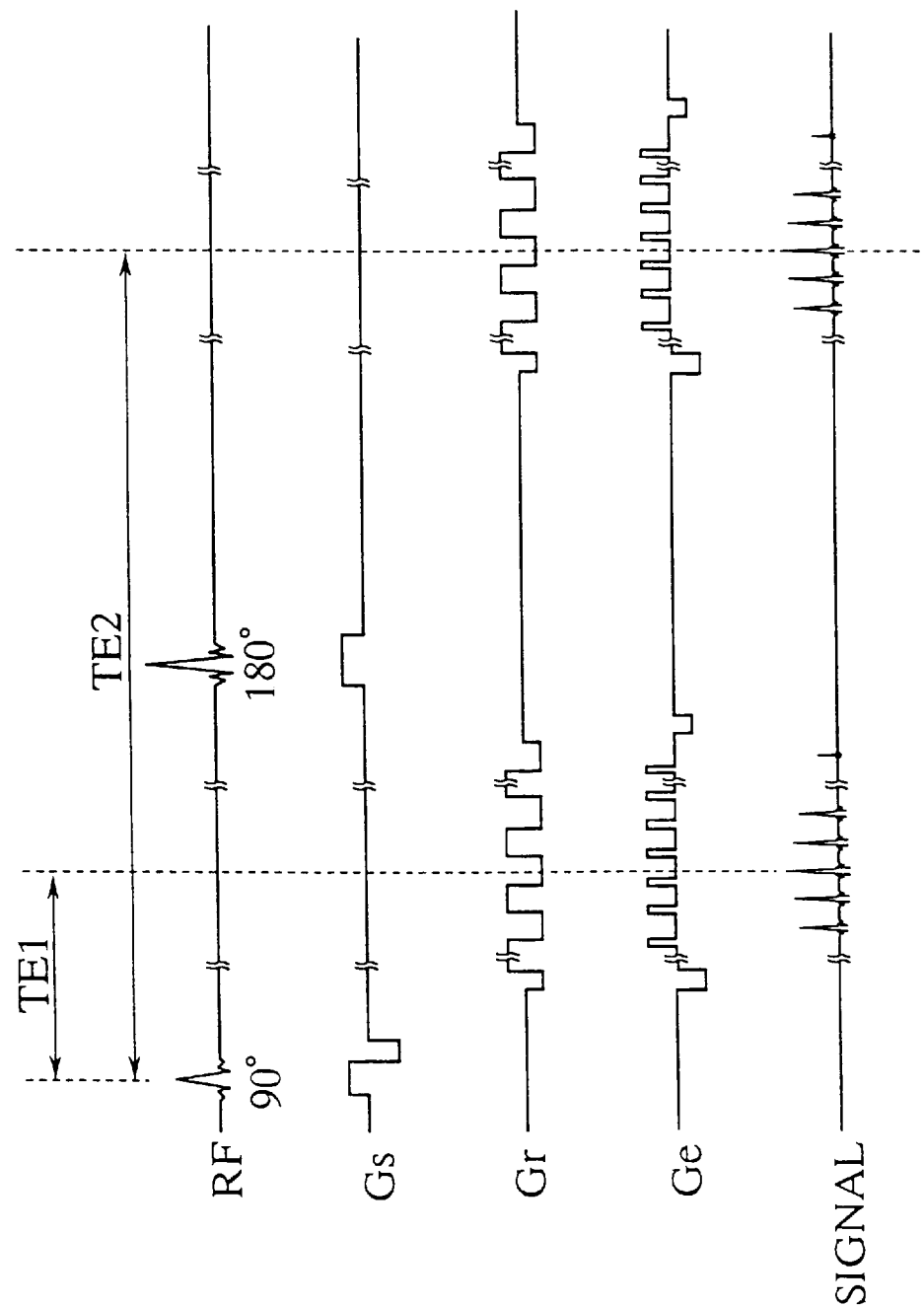

FIG. 10 illustrates a case of using a spin echo technique for the second data acquisition. For the first time of the data acquisition (echo time TE1), the data where the change of $T_2^*$ is emphasized are acquired. Then, by acquiring the second data (echo time TE2) obtained after 180° RF pulse having been applied, there are acquired data having no $T_2^*$ effect. Then, an effective TE1 for the first data acquisition is taken preferably as long as possible.

Figure 11:
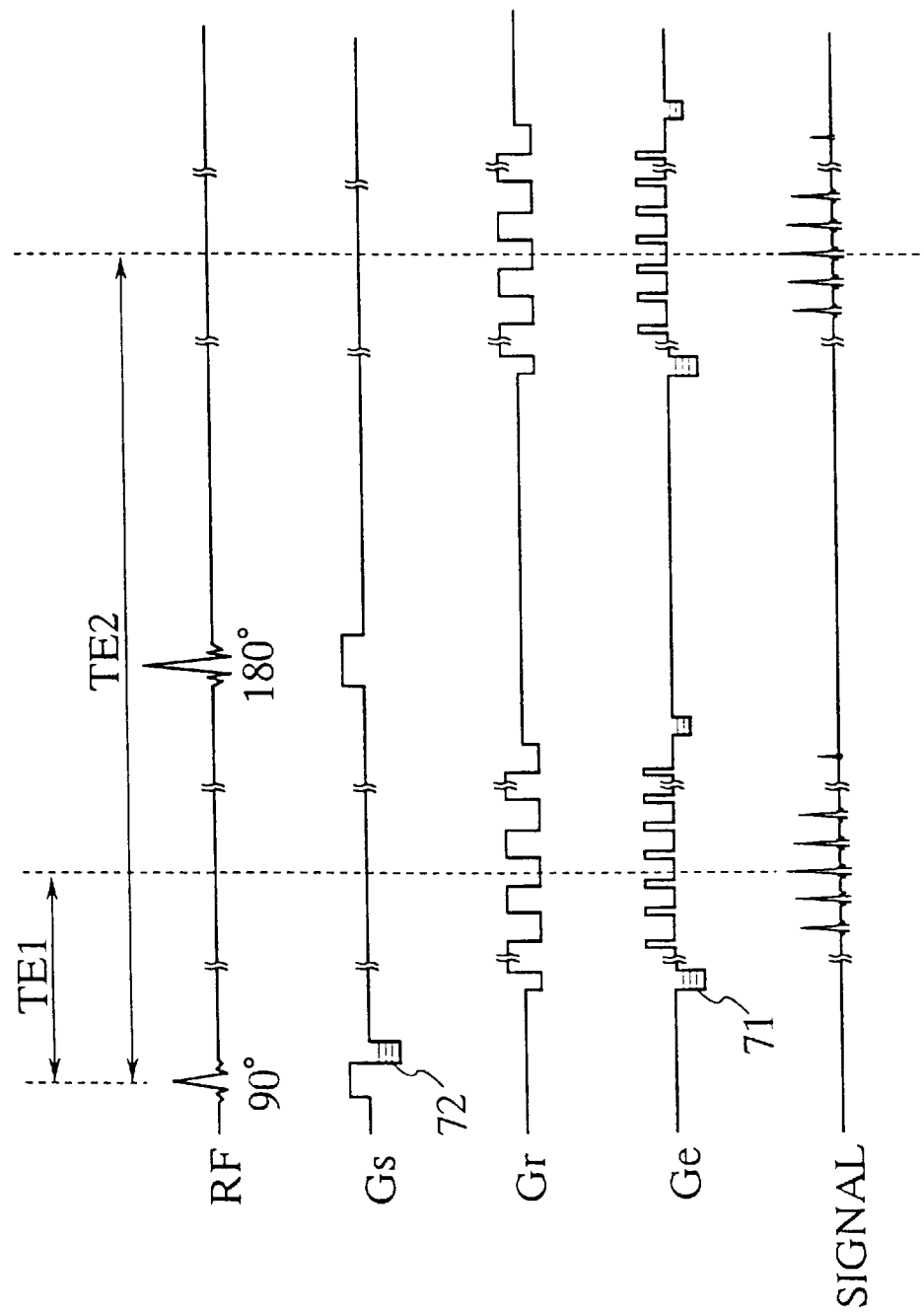

FIG. 11 illustrates a case where there are added encode steps 71 and 72 to the pulse sequence shown in FIG. 10.

The first embodiment can be modified by other modified examples described above. For example, a multiple slice method or three-dimensional imaging can be carried out. The vein image and the brain functional image thus obtained may be each processed by a maximum intensity projection technique or the like, and thereafter may be superimposed on to each other to be displayed.

Second Embodiment

Figure 12:
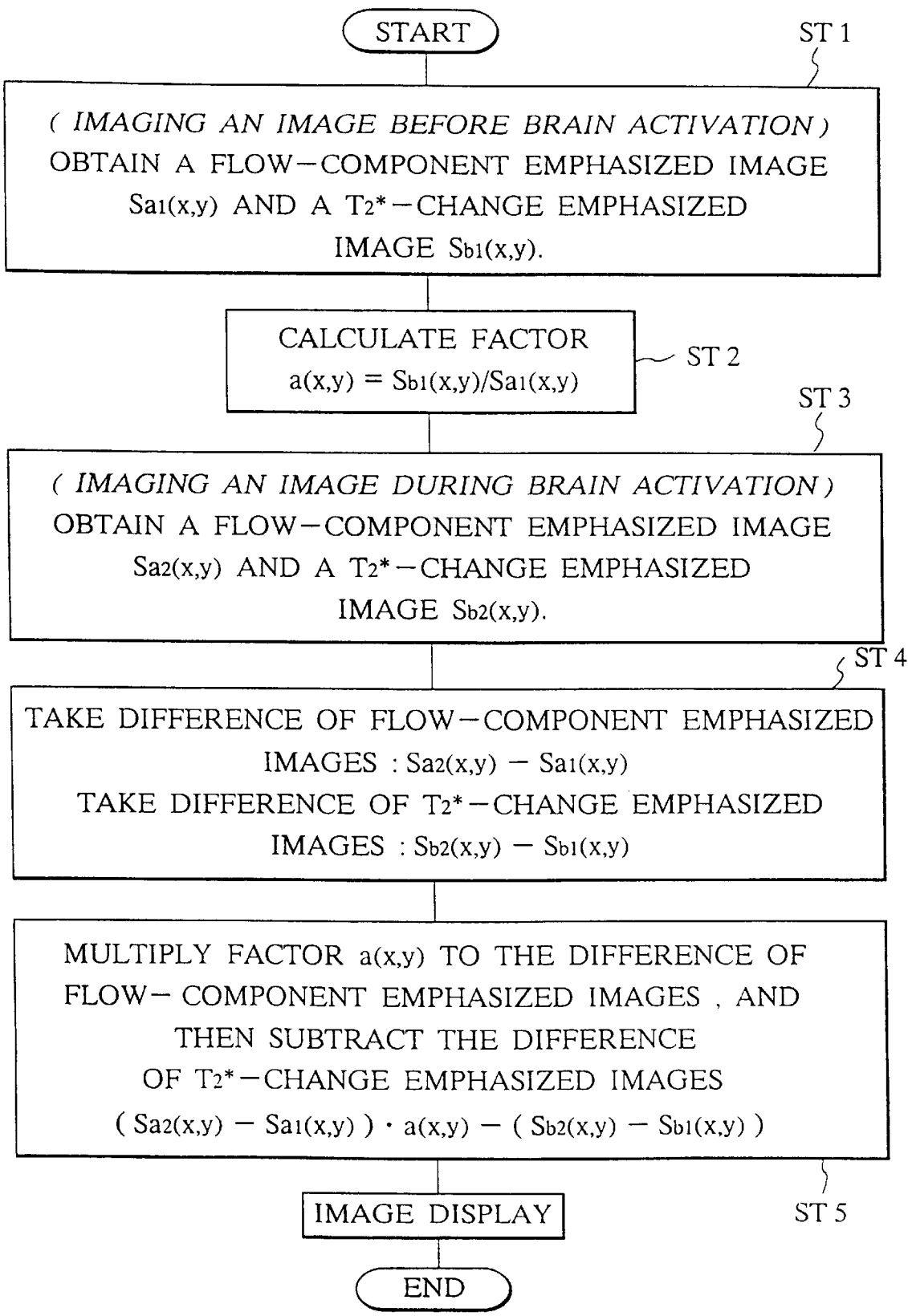
FIG. 12 is a flow chart showing the second embodiment.

FIG. 12 is a flow chart showing the second embodiment. In this second embodiment, an image value corresponding to the vein portion is further suppressed so that the distinction between the cortex and the vein portion is made further clarified. Operation therefor is shown in the flow chart of FIG. 12.

First, prior to the brain activation, by performing the technique described in the first embodiment shown in FIG. 6, there are obtained the blood vein image that is the flow-component-emphasized image, and the brain function image that is the $T_2^*$-emphasized image (Step ST1). A factor is multiplied to one thus obtained two images, a factor for each pixel is obtained so that its difference value is minimized (Step ST2). In other words, if a signal value of the image where the flow-component is emphasized is $S_{a1}(x, y)$, and the signal value for the image where the change of $T_2^*$ is emphasized is $S_{b1}(x, y)$, then there is obtained the factor $a(x,y)=S_{b1}(x, y)/S_{a1}(x, y)$.

$$\text{Now, } S_{a1}(x, y) \cdot a(x, y) - S_{b1}(x, y) = 0 \tag{2}$$

The difference between $S_{a1}(x, y)$ and $S_{b1}(x, y)$ accounts for the difference between TE1 and TE2 (here, $T_2$ and $T_2^*$ in the tissue are same), and the following equation (3) holds:

$$a(x, y) = \{S_{b1}(x, y)/S_{a1}(x, y)\} = exp\{-(TE2-TE1)/T_2^*\} \tag{3}$$

Next, similar to step ST1, at the time of brain activation, there are obtained the blood vein image that is the flow-component-emphasized image, and the brain function image that is the $T_2^*$-emphasized image. If a signal value of the image where the flow-component is emphasized is $S_{a2}(x, y)$, and the signal value for the image where the change of $T_2^*$ is emphasized is $S_{b2}(x, y)$ (Step ST3), its ratio is expressed by equation (4).

$$S_{b2}(x, y)/S_{a2}(x, y) = exp\{-(TE2-TE1)/(T_2^*+\alpha)\} \tag{4}$$

Thereafter, there are taken a difference between the flow-component-emphasized images $(S_{a2}(x, y)-S_{a1}(x, y))$ and another difference between $T_2^*$-change-emphasized images $(S_{b2}(x, y)-S_{b1}(x, y))$ (Step ST4). Thereafter, to the two images obtained therefrom, the factor $a(x, y)$ is multiplied to the image $(S_{a2}(x, y)-S_{a1}(x, y))$ to which the factor was multiplied when the factor is calculated, so as to obtain the difference image $\{(S_{a2}(x, y)-S_{a1}(x, y)) \cdot a(x, y)-(S_{b2}(x, y)-S_{b1}(x, y))\}$ (Step ST5). That is, there is obtained the following equation (5).

$$(S_{a2}(x,y) - S_{a1}(x,y)) \cdot a(x,y) - \tag{5}$$
$$(S_{b2}(x,y) - S_{b1}(x,y)) = S_{a2}(x,y) \cdot S_{b1}(x,y)/S_{a1}(x,y)) - S_{b2}(x,y)$$

Here, among pixels of images obtained at the time of brain activation, the portion which became a bright area due to the time-of-flight effect and not due to the $T_2^*$ change leads to the fact that equations (3) and (4) become same, so that the following equation (6) holds.

$$S_{b1}(x,y)/S_{a1}(x,y) = exp\{-(TE2-TE1)/T_2^*\} = S_{b2}(x,y)/S_{a2}(x,y) \tag{6}$$

Hence, equation (5) becomes:

$$S_{a2}(x,y) \cdot S_{b1}(x,y)/S_{a1}(x,y)) - S_{b2}(x,y) = \tag{7}$$
$$S_{a2}(x,y) \cdot S_{b2}(x,y)/S_{a2}(x,y) - S_{b2}(x,y) = 0$$

Accordingly, the portion which does not correspond to the $T_2^*$ change can be cancelled out. In actuality, both the time-of-flight effect and the $T_2^*$ change are taking place simultaneously, and the cancellable portion is the component caused by the time-of-flight effect, so that the signal corresponding to the vein portion located in a downstream side to the cortex is reduced. As a result, the distinction between the cortex and the vein can be easily clarified.

Figure 30:
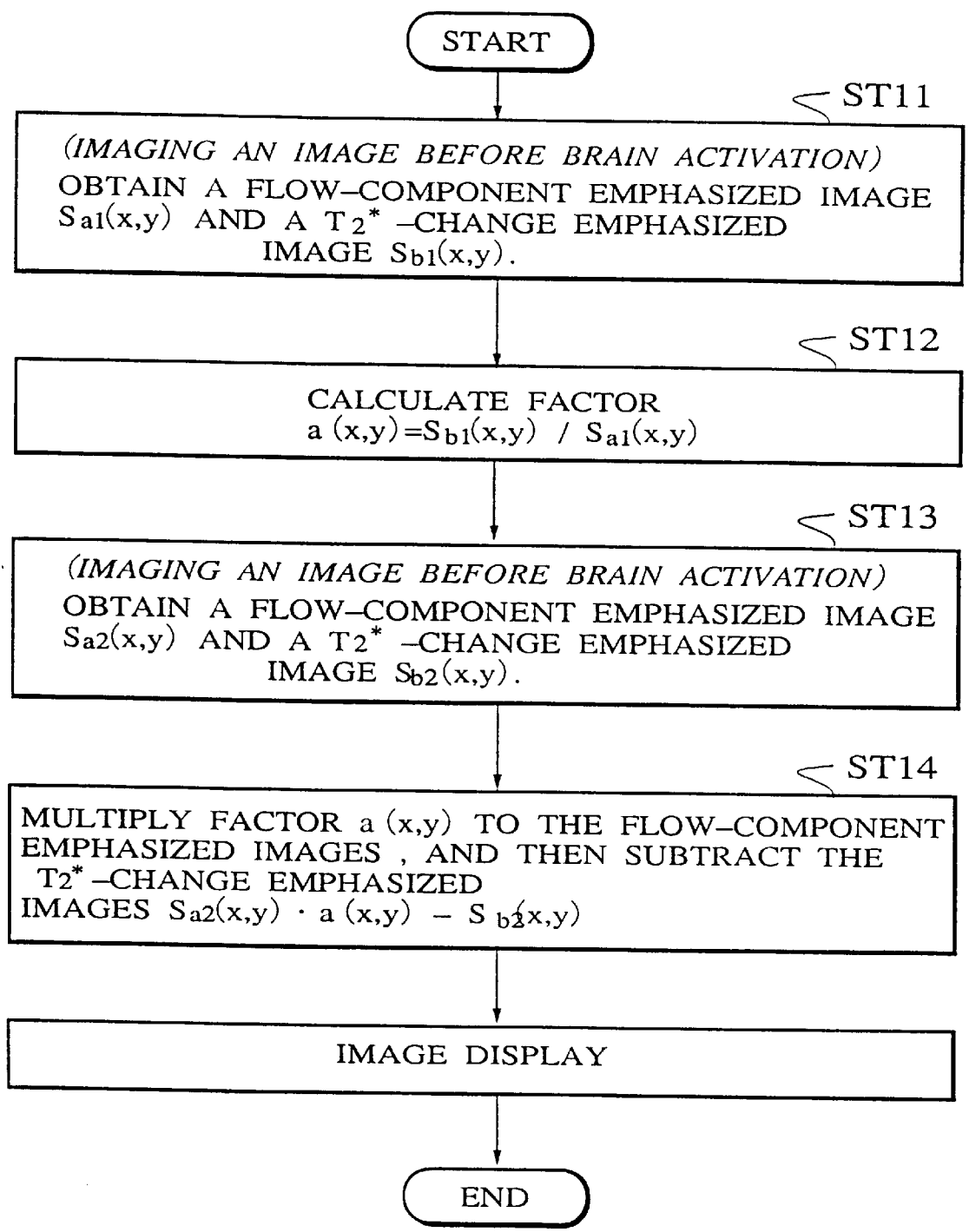
FIG. 30 is a flow chart showing another variation (steps ST 11–ST14) for the second embodiment shown in FIG. 12.

FIG. 30 is a flow chart showing another variation (steps ST11–ST14) for the second embodiment shown in FIG. 12. Referring to FIG. 30, the same result can be obtained as achieved by the operational flow chart shown in FIG. 12, based on equation (5). Moreover, as for calculation of factor $a(x, y)$, an inverse number $S_{a2}(x,y)/S_{b1}(x, y)$ of the factor shown in ST2, ST12 (FIG. 12, FIG. 30) may be so defined and the inverse number $S_{a2}(x, y)/S_{b1}(x, y)$ can be multiplied to the image of $S_{b2}(x, y)$, so as to obtain the same result as by FIG. 12.

It shall be appreciated that, when calculation is performed on the images before and after the brain activation, various means for reducing the effect due to the motion may be implemented before the above calculation is carried out. The various means for reducing the motion-caused effect include a motion correcting processing such as a statistical processing, a correlation calculation, a phase error detection, and so on.

Figure 14:
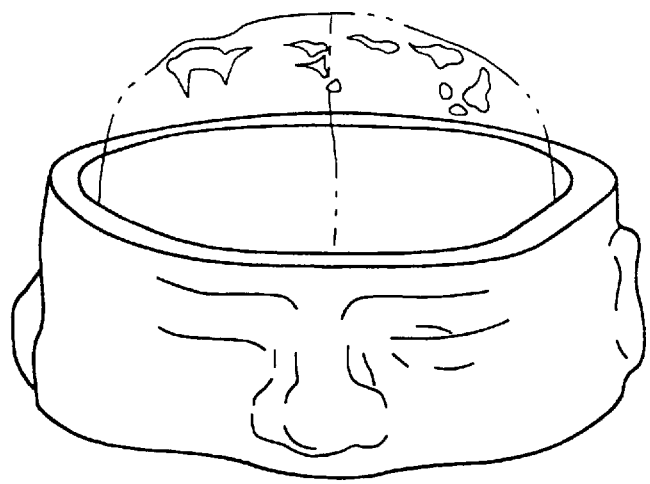
FIG. 14 show another display example for the brain function image.

Next, how to display the image thus obtained will be described. FIGS. 13 (a)–(d) show display examples for the brain function images. FIG. 14 show another display example for the brain function image.

For example, when the blood vessel image shown in FIG. 13(b) and the brain function image shown in FIG. 13(c) are obtained in a manner of the present invention, the brain function image and blood vessel can be accurately and easily recognized as such, as shown in FIG. 13(d), by displaying them in a manner that these images are superimposed on the brain image obtained in other technique. Any of images represented by FIGS. 13(a), 13(b), 13(c) or two images combined thereamong may be independently displayed. In this case, using various displaying colors may further ease reading the image. Then, as for three-dimensional data obtained by the multi-slice technique or 3DFT technique, such data may be superimposed by performing processes such as a surface representation technique and a maximum intensity projection technique, after having been threshold-processed. For example, FIG. 13(a) shows the brain surface from anatomical data, FIG. 13(b) shows angiographical image by the maximum intensity projection technique, and FIG. 13(c) shows the image where the surface of the activated portion is extracted.

Referring to FIG. 14, while the brain image is being displayed in a translucent state, the brain function may be displayed on the brain anatomical image, so that the brain anatomical image information can be recognized with ease. The functional and anatomical images are overlapped, and the anatomical image is being displayed in a translucent state, so that the positional relationship of the anatomical image-on the brain activated area can be easily clarified. Overall, the brain anatomical image can be freely viewed from an various directions, and thus can be freely rotated on request.

Referring still to FIG. 13(a)–13(d), by overlapping the image of FIG. 13(a) and that of FIG. 13(c), the following (I) can be carried out:

(1) the brain surface is extracted from the anatomical data (FIG. 13(a));

(2) the data corresponding to the outside thereof is set to zero based on the thus obtained image of the brain surface; or (3) the blood vessels existing outside the brain surface can be eliminated by utilizing an technique where the surface processing operation is carried out only in an inside region of the brain surface obtained, so that the activated region can be easily clarified.

Moreover, the cortex region may be clarified by utilizing the angiographic data of FIG. 13(b). Moreover, there may be implemented a technique (II) where after taking AND (intersection) of data of FIG. 13(b) and the brain functional data of FIG. 13(c), the AND-taken data of the brain functional data (FIG. 13(c)) are set to zero. Thereby, the signals corresponding to the blood portion are eliminated from the brain functional data of FIG. 13(c), so that the signals for the cortex portion can be extracted more accurately. Thereafter, the thus obtained data may be superimposed on the anatomical data of FIG. 13(a).

Moreover, both of the above processes represented by (I) and (II) may be performed at a time.

Moreover, we intend to claim a novelty of the present invention being characterized in that above overlapping of the angiographical image over the functional image may be carried out in a manner that an MR angiographical image obtained by the conventional MR angiography technique and a functional image obtained by an other conventional technique are superimposed on each other.

Third Embodiment

Figure 1:
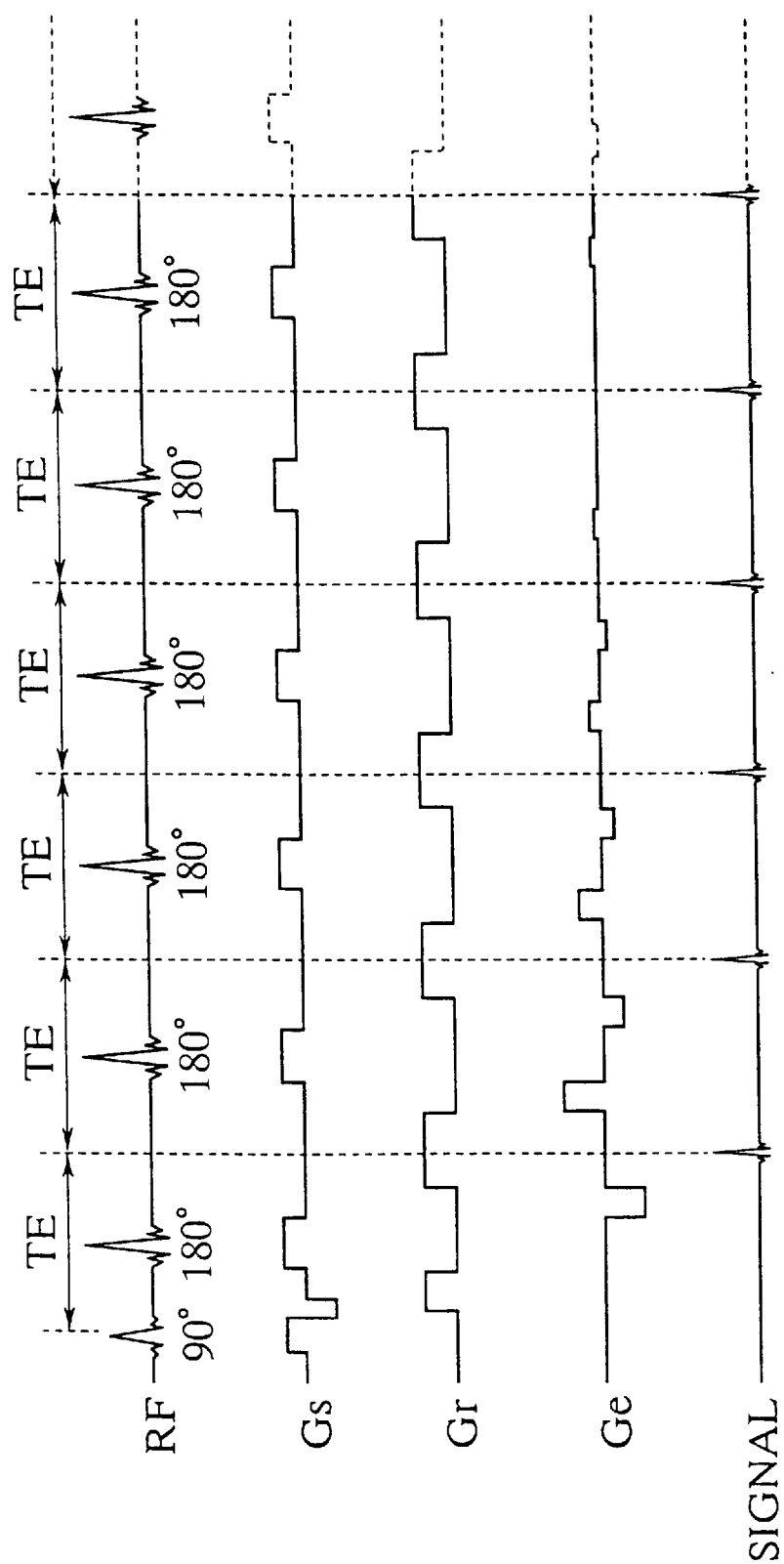
FIG. 1 shows a pulse sequence by the conventional fast spin echo (FSE) method.
Figure 2:
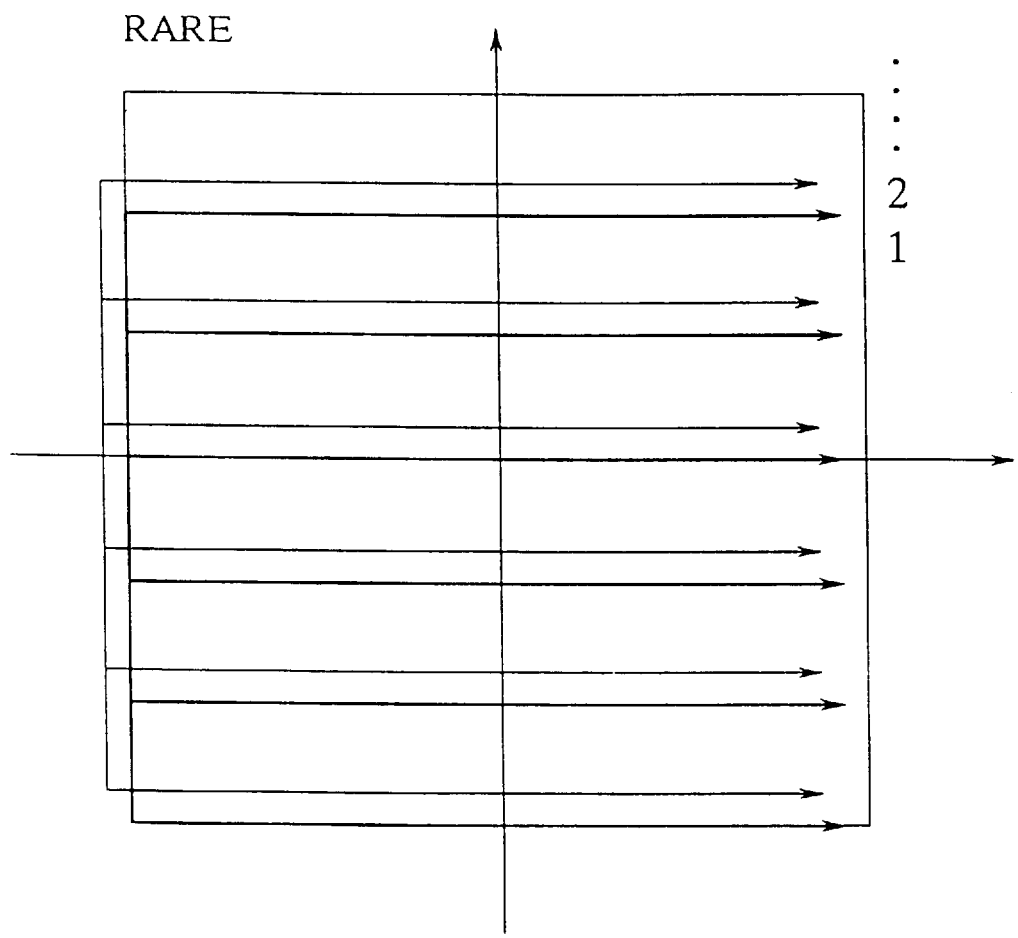
FIG. 2 shows a data acquiring locus on the "K" space according to the fast spin echo (FSE) method shown in FIG. 1.

Referring to FIG. 1, in the fast spin echo (FSE) technique, after a nuclear spin is excited by a 90° pulse, multiple spin echoes are generated by applying a plurality of 180° pulses. Thereby, a different phase encoding amount is given to each echo and the image is thus reconstructed so as to perform the fast imaging. In this conventional fast spin echo technique, a locus as shown in FIG. 2 is depicted on a "K" space or a Fourier space.

Figure 17:
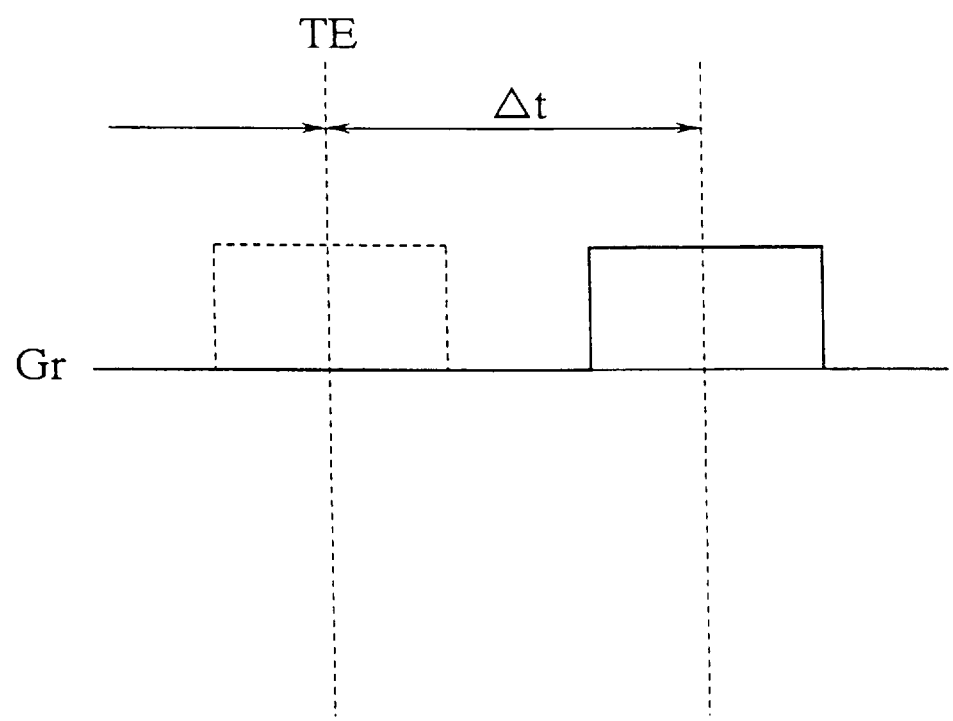
FIG. 17 illustrates a basic principle of the third embodiment, where a position of readout gradient magnetic field that is an echo position refocused by the readout gradient magnetic field is shifted by Δt from a central time of the spin echo.

In this conventional method, there is used only a spin echo in which the magnetic inhomogeneity is not likely to be affected, so that the $T_2^*$ distribution for tissues can not be image-formed. In view of this drawback, referring to FIG. 17 showing a basic principle of the third embodiment, a position of readout gradient magnetic field that is an echo position refocused by the readout gradient magnetic field is shifted by $\Delta t$ from a central time of the spin echo. Signal deterioration caused then is equal to $\exp(-\Delta t/T_2^*)$. Since $T_2^* \cong 1/\pi\Delta f$ and $2\pi\Delta f = \gamma\Delta H$, $T_2^* \cong 500$ ms at 1.5 T and the signal strength change of approximately 2% is obtained at $\Delta t=10$ ms, if a half band width $\Delta H$ for the magnetic inhomogeneity within a single pixel is approximately 0.01 ppm.

Figure 18:
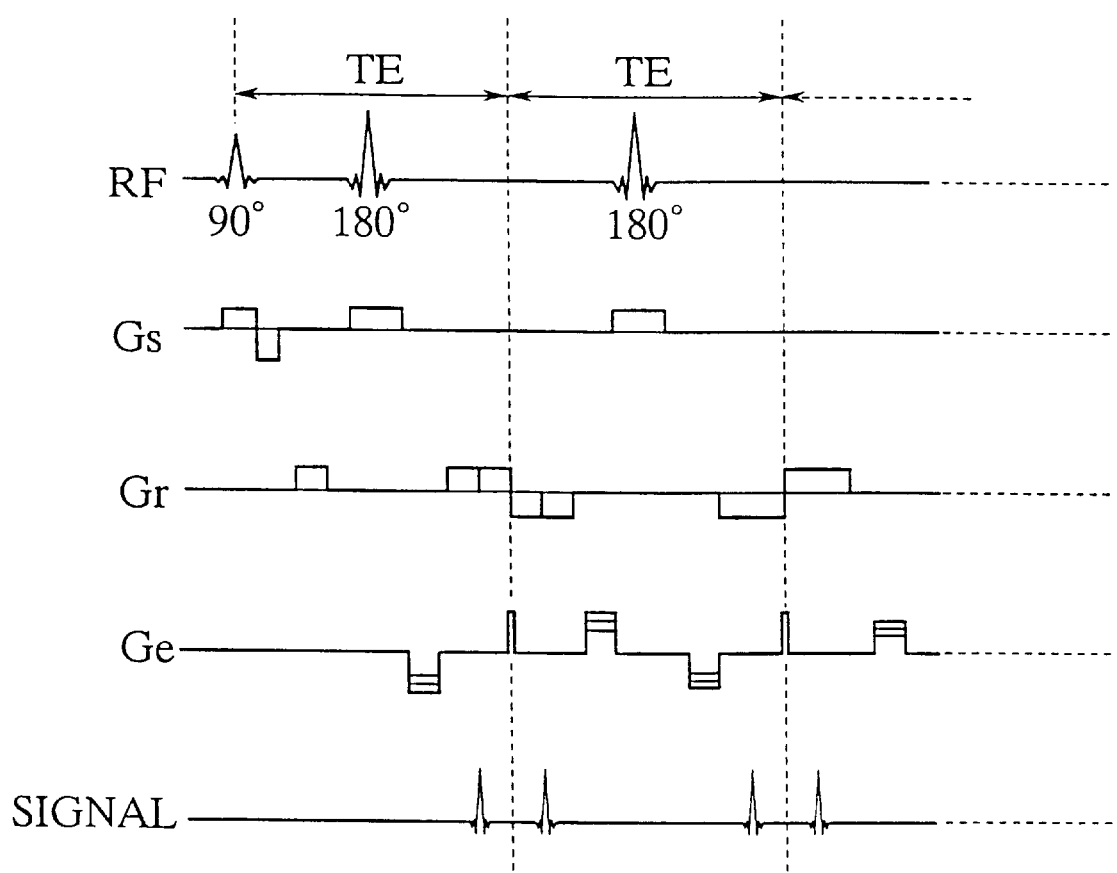
FIG. 18 is a pulse sequence by which the $T_2^*$ imaging is performed utilizing the principle according to the third embodiment.
Figure 19:
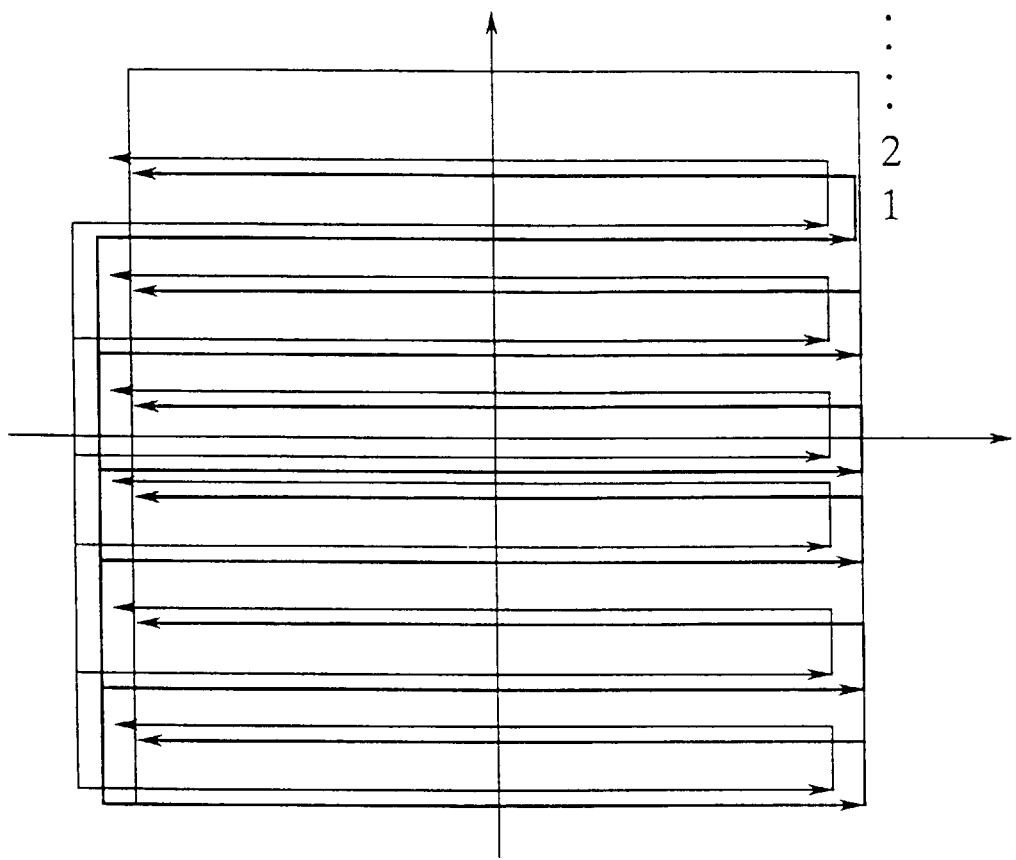
FIG. 19 is the data acquiring locus on the "K" space according to FIG. 18.

FIG. 18 is a pulse sequence by which the $T_2^*$ imaging is performed utilizing the above principle according to the third embodiment. In this example shown in FIG. 18, when an echo generating position is simply shifted by $\Delta t$ from the central time of the spin echo, the time at an opposite side with respect to the central time is wasted;therefore, there are generated gradient echoes at both sides of the spin echo's central time, Then, when there is given the same amount of the phase encode at both sides of the spin echo, only same data can be obtained thereby. Thus, as shown as Gc in FIG. 18, an encode pulse is given in the central time of the spin echo. Thereby, the amount of the phase encode differs at both sides of the spin echo. FIG. 19 is the data acquiring locus on the "K" space according to FIG. 18. In other words, different amounts of phase encodes are provided to the gradient echo at both sides of the spin echo, so as to reconstruct the image. Thereby, in this case, the $T_2^*$ imaging can be performed utilizing the fast spin echo technique, twice as fast, with the same number of RF refocus pulses.

Figure 20:
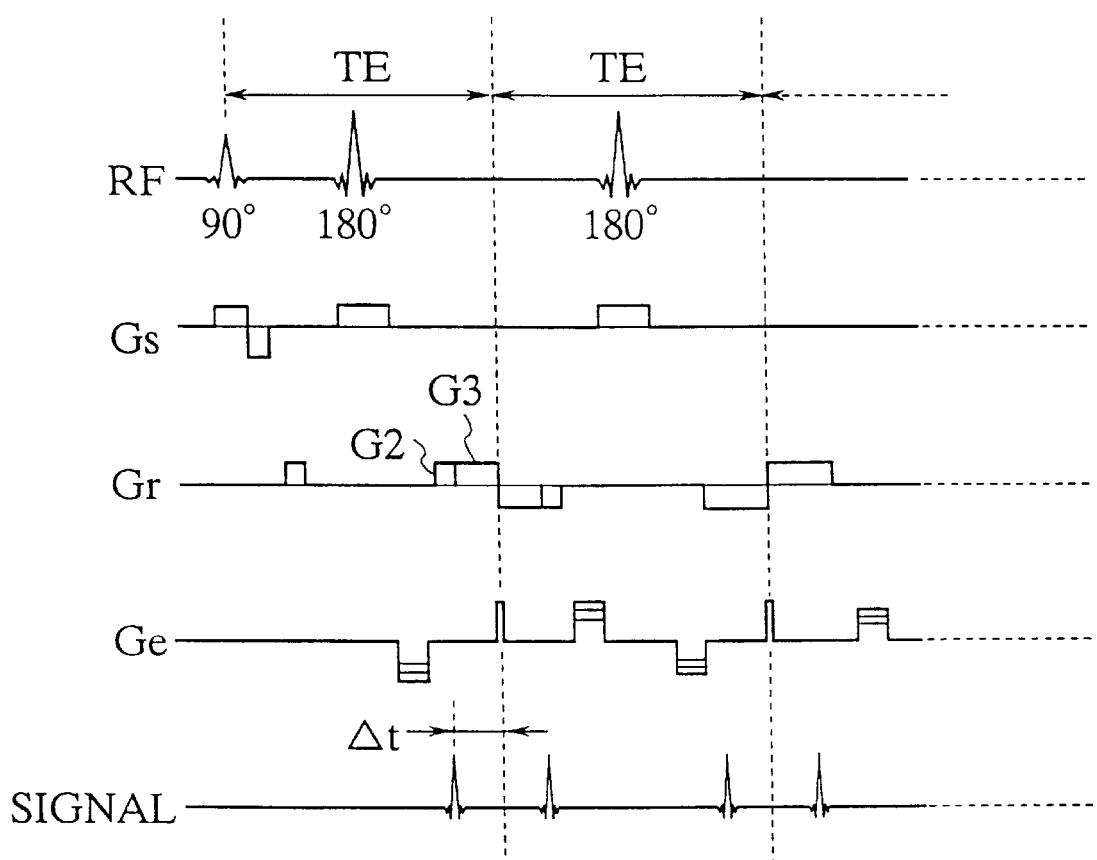
FIG. 20 is a pulse sequence showing a modified example for the third embodiment.
Figure 21:
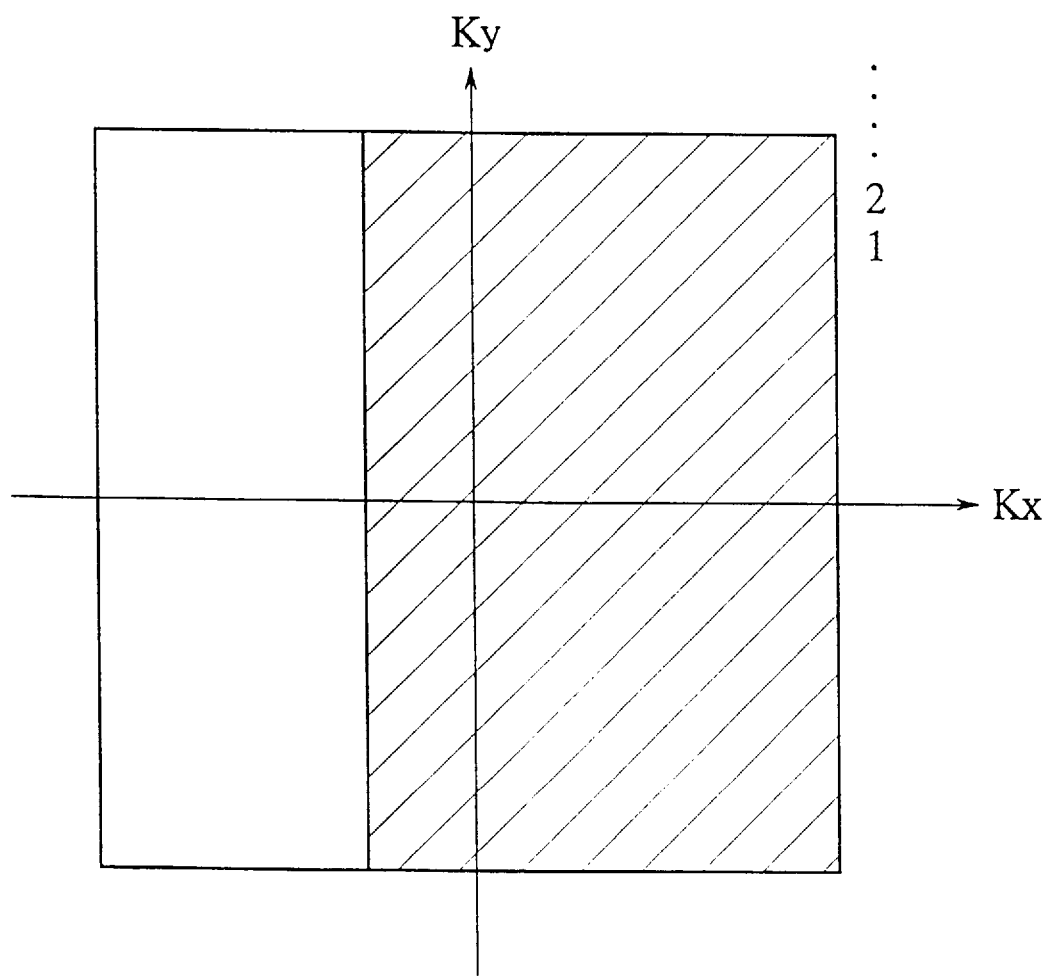
FIG. 21 shows the data acquiring region on the "K" space according to the above modified example for the third embodiment; non-hatched area corresponds to a vacant area due to the asymmetry of the gradient echo.

FIG. 20 is a pulse sequence showing a modified example for the third embodiment. Differing from the pulse sequence shown in FIG. 18, the size of the gradient magnetic field Gr in the readout direction shown as G2 and G3 is set differently. Thus, the gradient echo generated thereby becomes asymmetric, and the extension of the sequence length caused by the shift amount $\Delta t$ from the spin echo can be shortened. In other words, though the sequence length is prolonged when the $\Delta t$ is made longer, the sequence length can be shortened by letting the gradient echo be asymmetric. FIG. 21 shows the data acquiring region on the "K" space according to the above modified example for the third embodiment; non-hatched area corresponds to a vacant area due to the asymmetry of the gradient echo. However, referring to FIG. 21, there is caused an area in which the data can not be acquired on the "K" space due to the asymmetric property. Such a vacant area can be supplemented by forming data in a manner of utilizing a zero filling method or a complex conjugate property of the acquired data.

Fourth Embodiment

Figure 22:
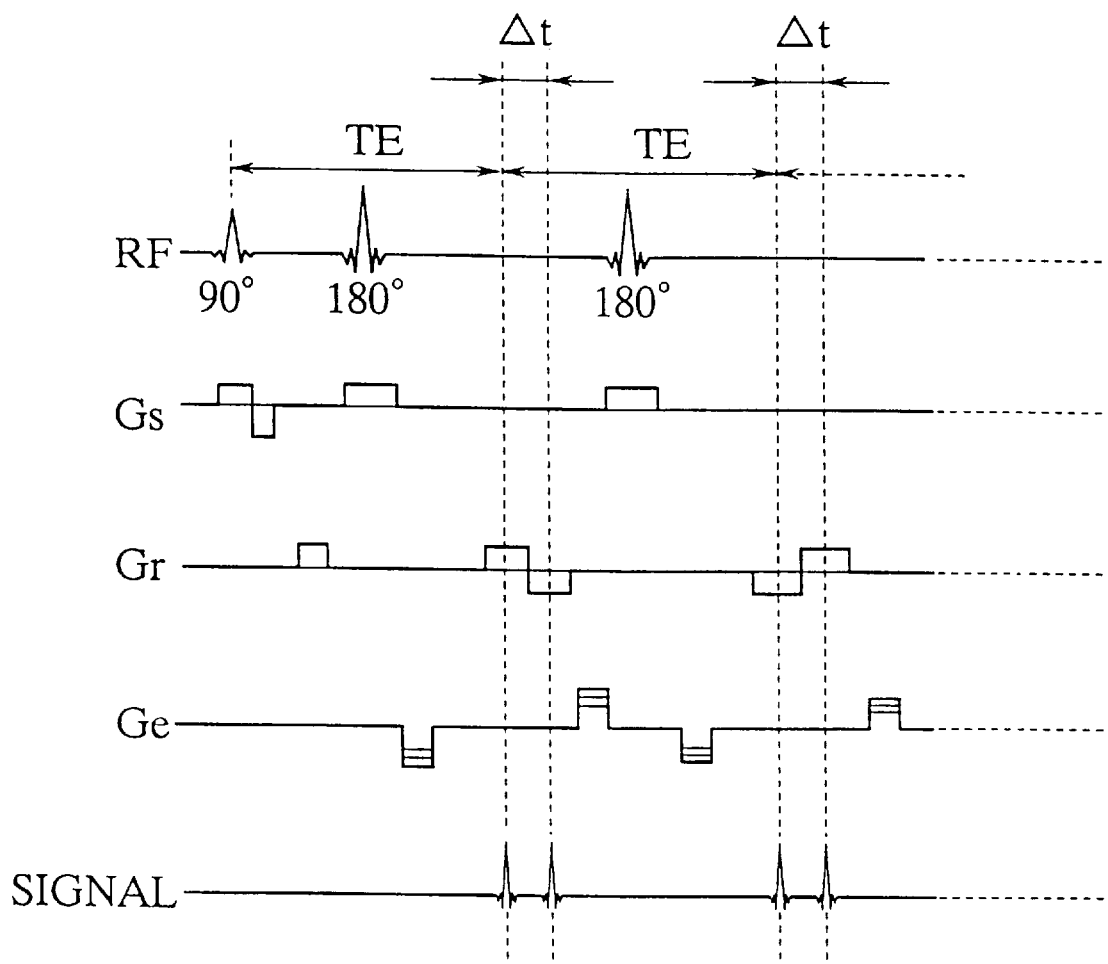
FIG. 22 is a pulse sequence according to the fourth embodiment; this fourth embodiment presents the pulse sequence of the hybrid method in which both the fast spin echo image and the $T_2^*$ imaging are simultaneously possible.

FIG. 22 is a pulse sequence according to the fourth embodiment. This fourth embodiment presents the pulse sequence of the hybrid method in which both the fast spin echo image and the $T_2^*$ imaging are simultaneously possible.

Namely, the readout gradient magnetic field Gr is applied as shown in FIG. 22 so that a spin echo is generated at the time of the echo time TE, and, furthermore, a gradient echo is generated after time $\Delta t$ elapses. As a result, by executing a single sequence, both the $T_2$-emphasized image and the $T_2^*$-emphasize image are simultaneously obtained. Then, thus obtained two picture images are subtracted from each other, so that a tissue in which only the change of $T_2^*$ occurs is imaged; for example, the magnetic field change caused at the time of change in oxidation and deoxidation of hemoglobin in a cerebral tissue capillary is detected, so that a brain function image can be obtained thereby.

Figure 23:
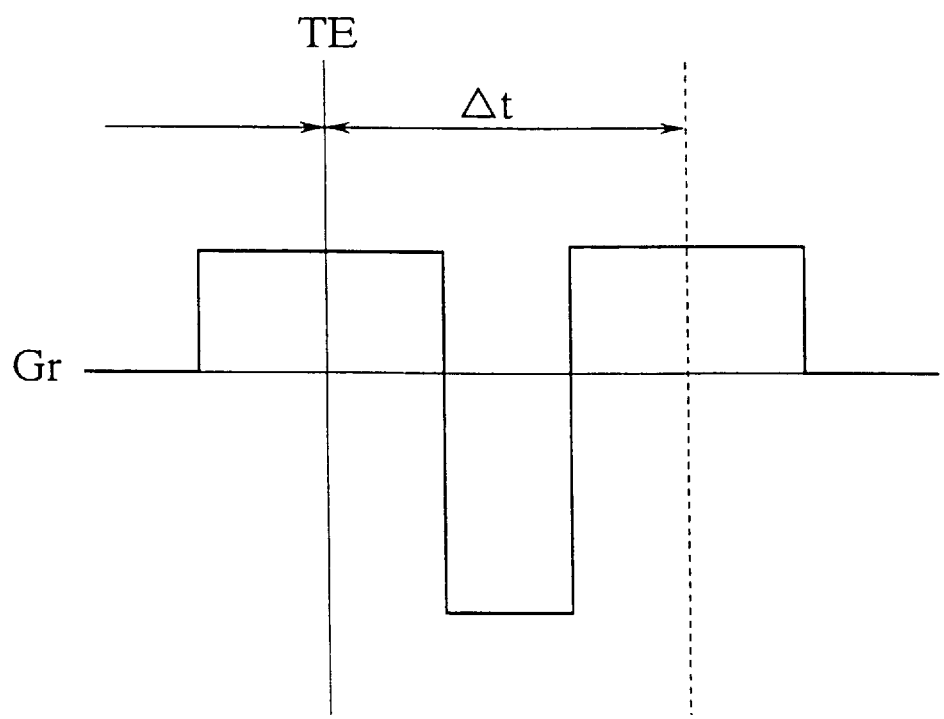
FIG. 23 shows another example of the fourth embodiment, characterized in that the echo generated by the readout gradient magnetic field waveforms at the same signal side (a positive side in FIG. 23) is implemented by once again reversing the readout gradient magnetic field waveform.

Here, referring to FIG. 23, it shall be appreciated that, by once again reversing the readout gradient magnetic field waveform, the echo generated by the readout gradient magnetic field waveforms at the same signal side (a positive side in FIG. 23) may be utilized. Thereby, reduced is an artifact due to influence difference of the static inhomogeneity at both positive and negative sides of the gradient magnetic field waveform.

Fifth Embodiment

Next, another example based on the fourth embodiment is described below by which further sped-up operation is realized utilizing a multiple gradient echo.

Figure 3:
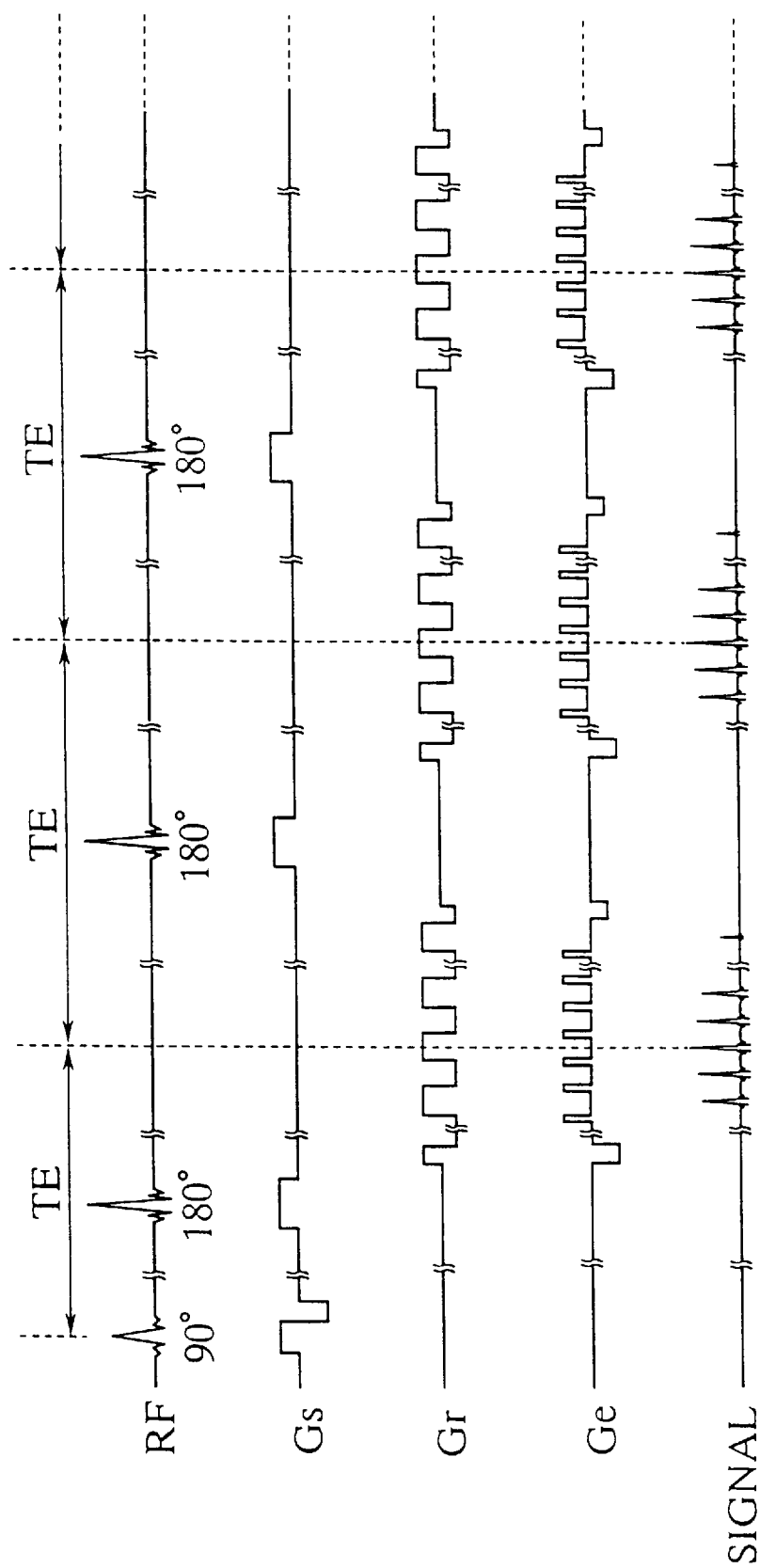
FIG. 3 shows a pulse sequence by the conventional hybrid imaging method.
Figure 4:
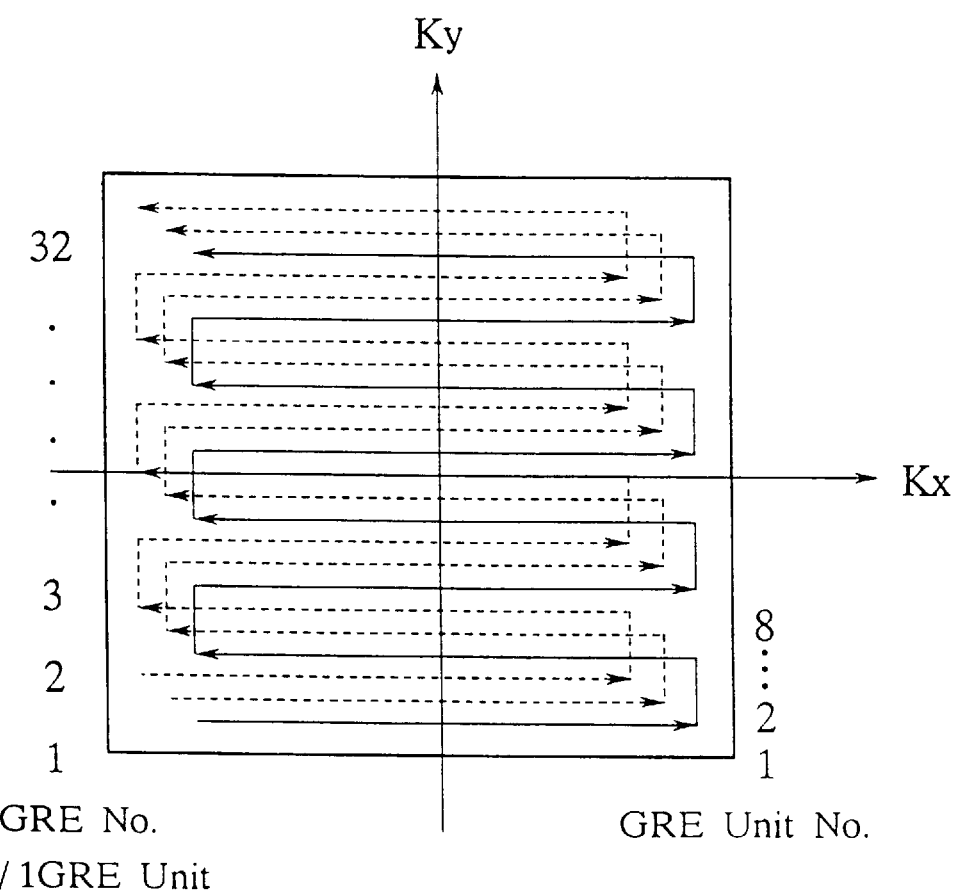
FIG. 4 shows a data acquiring locus on the "K" space according to the hybrid imaging method shown in FIG. 3.

FIG. 3 is a pulse sequence for the conventional hybrid imaging method, and FIG. 4 shows a data acquiring locus on the "K" space for FIG. 3. In the pulse sequence shown in FIG. 3 utilizing the multiple gradient echo, an encoder corresponded to the center of the image reconstruction data is corresponding to the spin echo, the $T_2^*$ imaging can not be performed with a sufficient sensitivity. Thus, in a similar manner shown in FIG. 17, a peak echo position for the multiple gradient echo is shifted by $\Delta t$ from the echo time of the spin echo.

Figure 24:
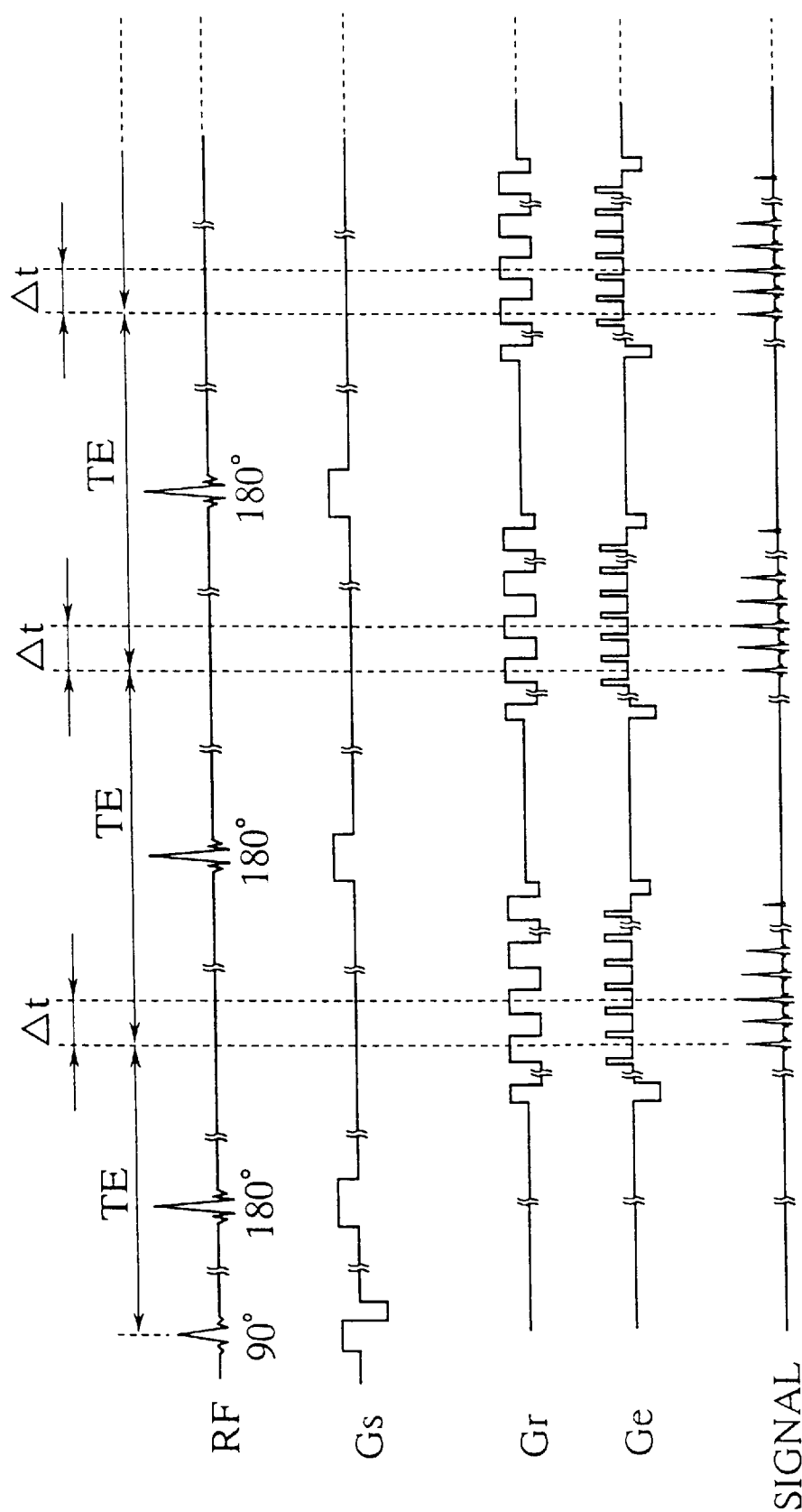
FIG. 24 shows a pulse sequence according to the fifth embodiment.

FIG. 24 shows a pulse sequence according to the fifth embodiment. As evident from FIG. 24, utilizing the multiple gradient echo technique, the peak echo position is shifted by $\Delta t$ from the occurring time of the spin echo. Therefore, the $T_2^*$-emphasized image can be obtained based on the thus acquired echo signals.

Figure 25:
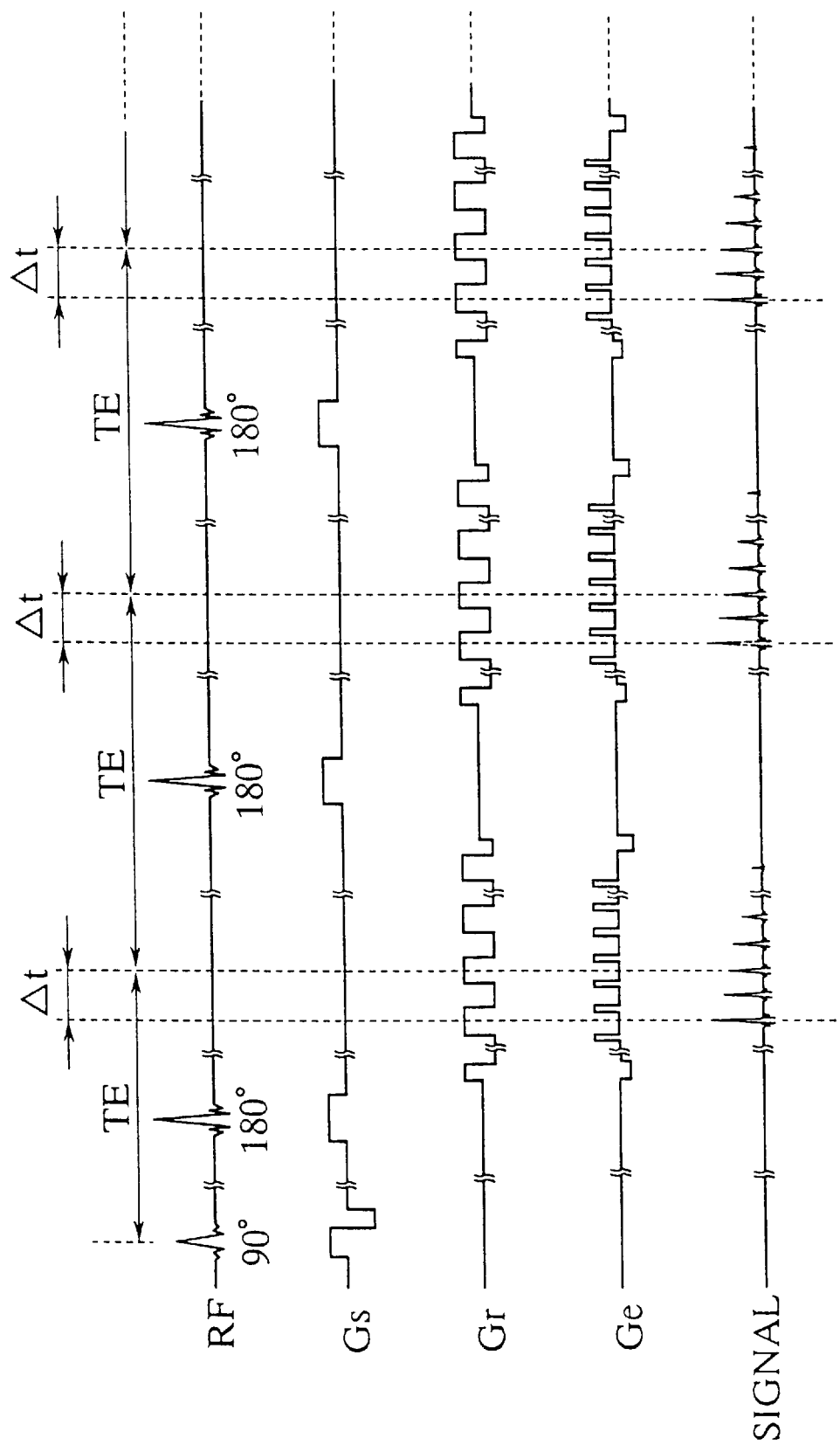
FIG. 25 is a pulse sequece according to a modified example for the fifth embodiment.

FIG. 25 is a pulse sequence according to a modified example for the fifth embodiment. In this example, data are acquired by utilizing an asymmetric encode. Therefore, the first half of the spin echo can be effectively made use of.

Figure 26:
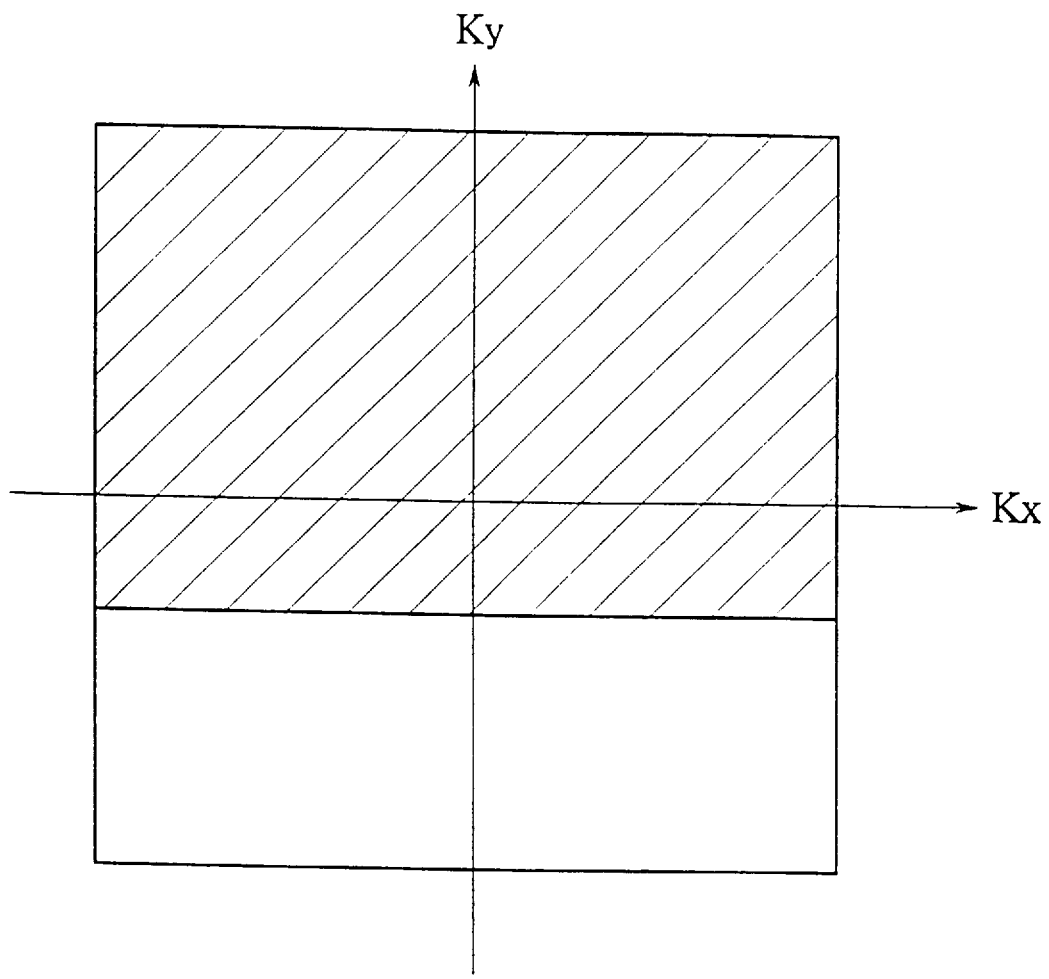
FIG. 26 shows the data acquiring area on the "K" space according to the modified exmaple of the fifth embodiment shown in FIG. 25.

FIG. 26 shows the data acquiring area on the "K" space according to the modified example of the fifth embodiment shown in FIG. 25; in FIG. 26, it is asymmetric in the encode direction. Similar to the modified example for the third embodiment shown in FIG. 21, there is caused an area in which the data can not be acquired on the "K" space due to the asymmetric property. Such a vacant area can be supplemented by forming data in a manner of utilizing a zero filling method or a complex conjugate property of the acquired data.

Sixth Embodiment

Figure 27:
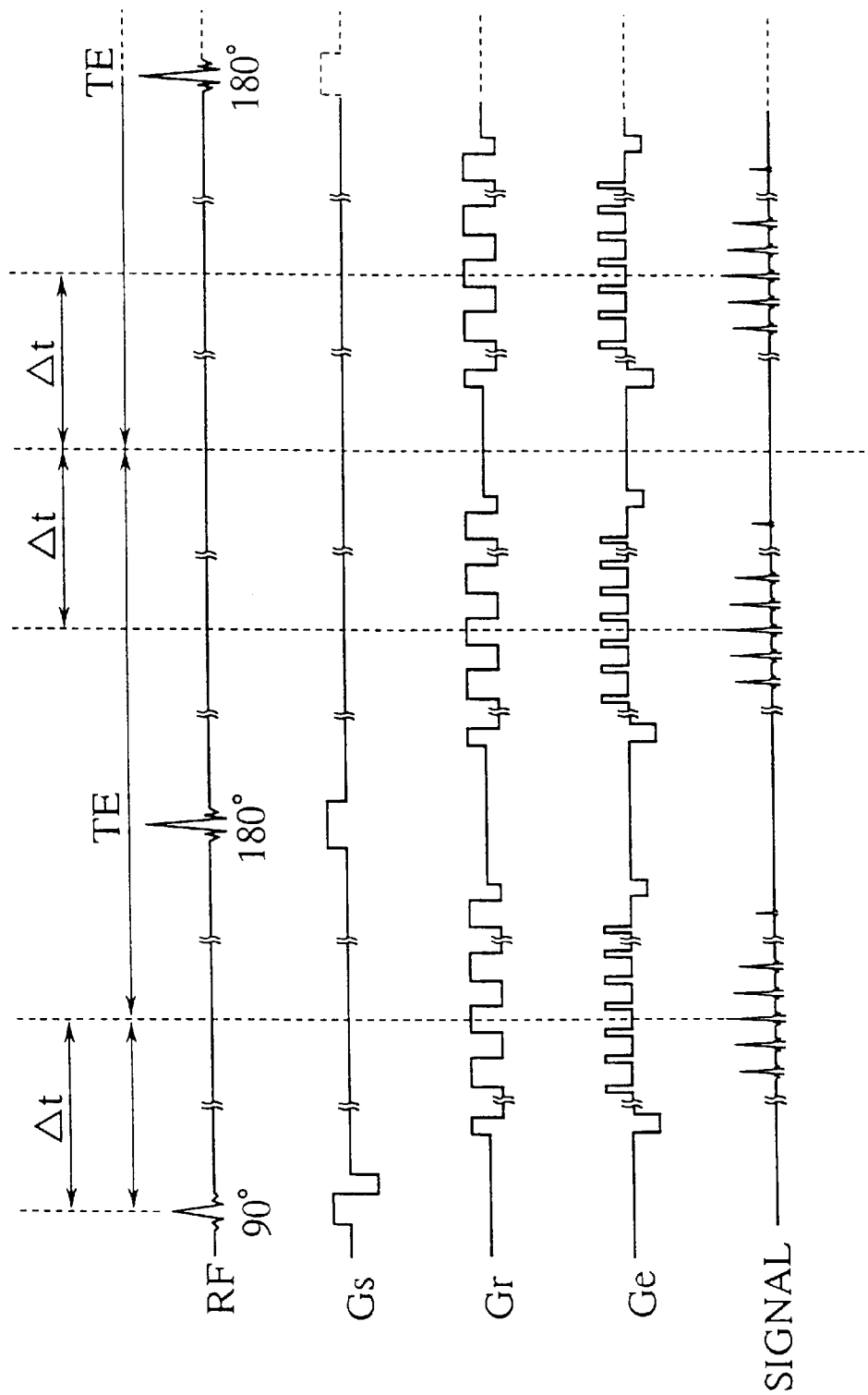
FIG. 27 is a pulse sequence using the $T_2^*$ hybrid imaging method, where two-block worth multiple gradient echoes for a single spin echo are generated.

FIG. 27 is a pulse sequence using the $T_2^*$ hybrid imaging method, where two-block-worth multiple gradient echoes for a single spin echo are generated, according to the fifth embodiment. Referring to FIG. 27, the shifting time $\Delta t$ from the spin echo's echo time to the peak echo position of the multiple gradient echo is longer, and the extension of the sequence length is minimized. In this sequence according to the sixth embodiment, the two-clock multiple gradient echoes for a single echo are generated, so that, even if the shifting time $\Delta t$ is longer, a wasted time will not be caused in an opposite side of the spin echo.

Figure 15:
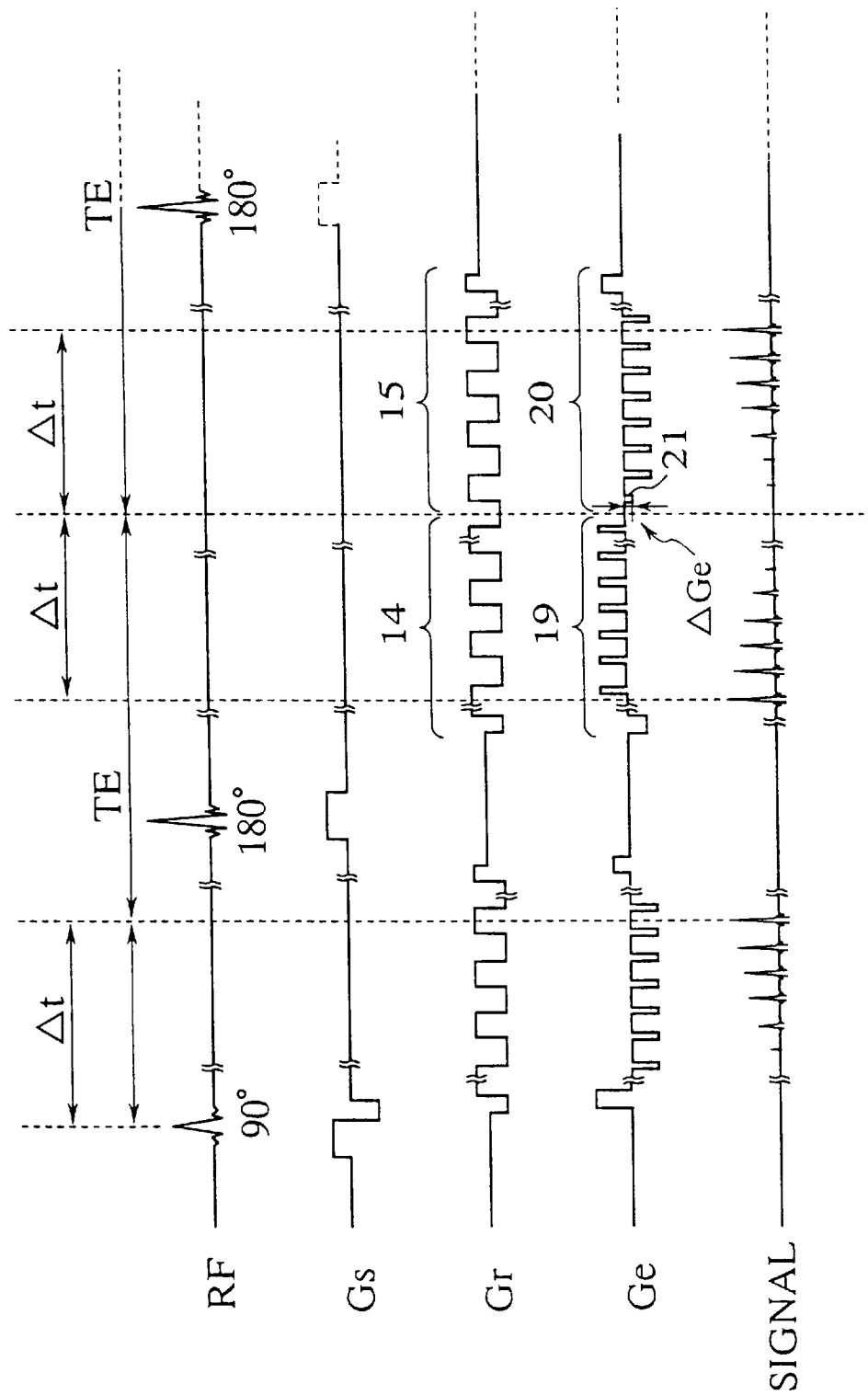
FIG. 15 is a pulse sequence showing a modified example (utilizing the asymmetric encode) for this sixth embodiment.
Figure 16:
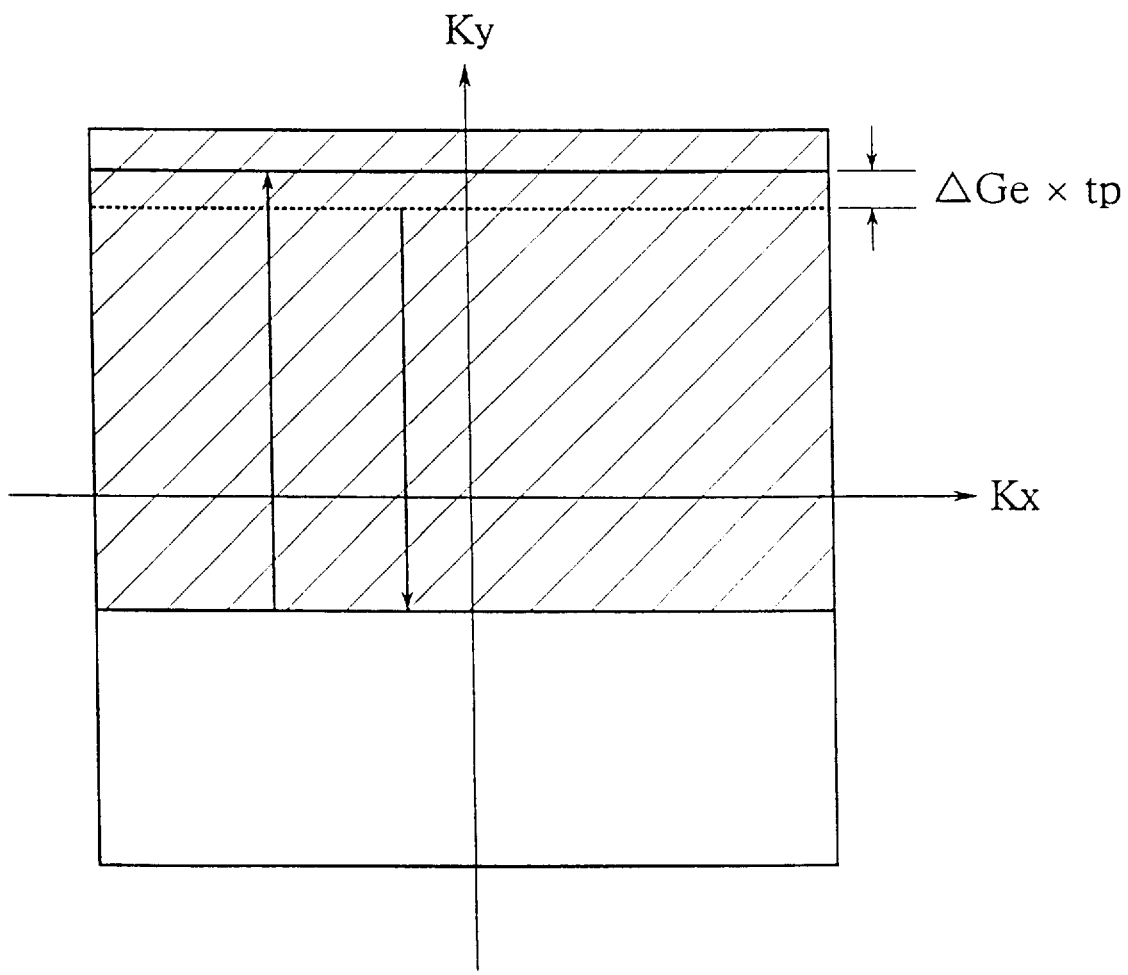
FIG. 16 is the data acquiring locus on the "K" space, based on signals shown in FIG. 15.

FIG. 15 is a pulse sequence showing a modified example (utilizing the asymmetric encode) for this sixth embodiment. In this modified example for the sixth embodiment, the asymmetric encode is used. Then, reversed are the signs for a phase encode gradient magnetic waveform 19 corresponding to a readout gradient magnetic field block 14 formed in the first half of the spin echo and a phase encode gradient magnetic field waveform 20 corresponding to a readout gradient magnetic field block 15 formed in the latter half of the spin echo. These scanning loci are shifted by a phase encode gradient magnetic field waveform 21. Then, the shifting amount of the scanning loci is the amount proportional to $\Delta Ge \times tp$ if an applying time width for the phase encode gradient magnetic field waveform 21 is denoted as tp and its amplitude as $\Delta Ge$. FIG. 16 is the data acquiring locus on the "K" space, based on signals shown in FIG. 15. Similar to the third embodiment, a vacant area on the "K" space (i.e., data that are not acquired on the "K" space) can be supplemented by forming data in a manner of utilizing the zero filling method or the complex conjugate property of the acquired data.

Figure 28:
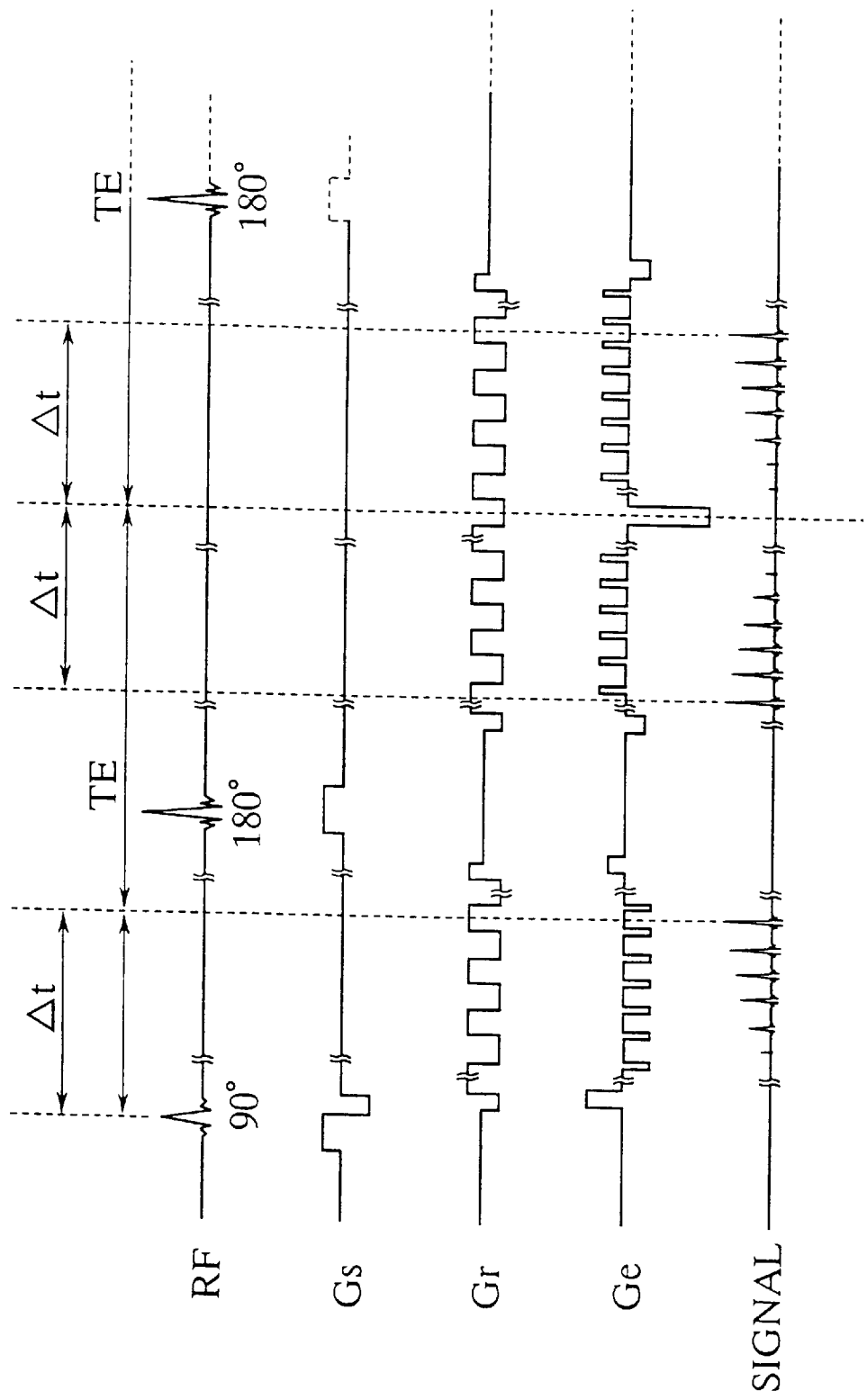
FIG. 28 is a pulse sequence showing another modified example for the sixth embodiment.
Figure 29:
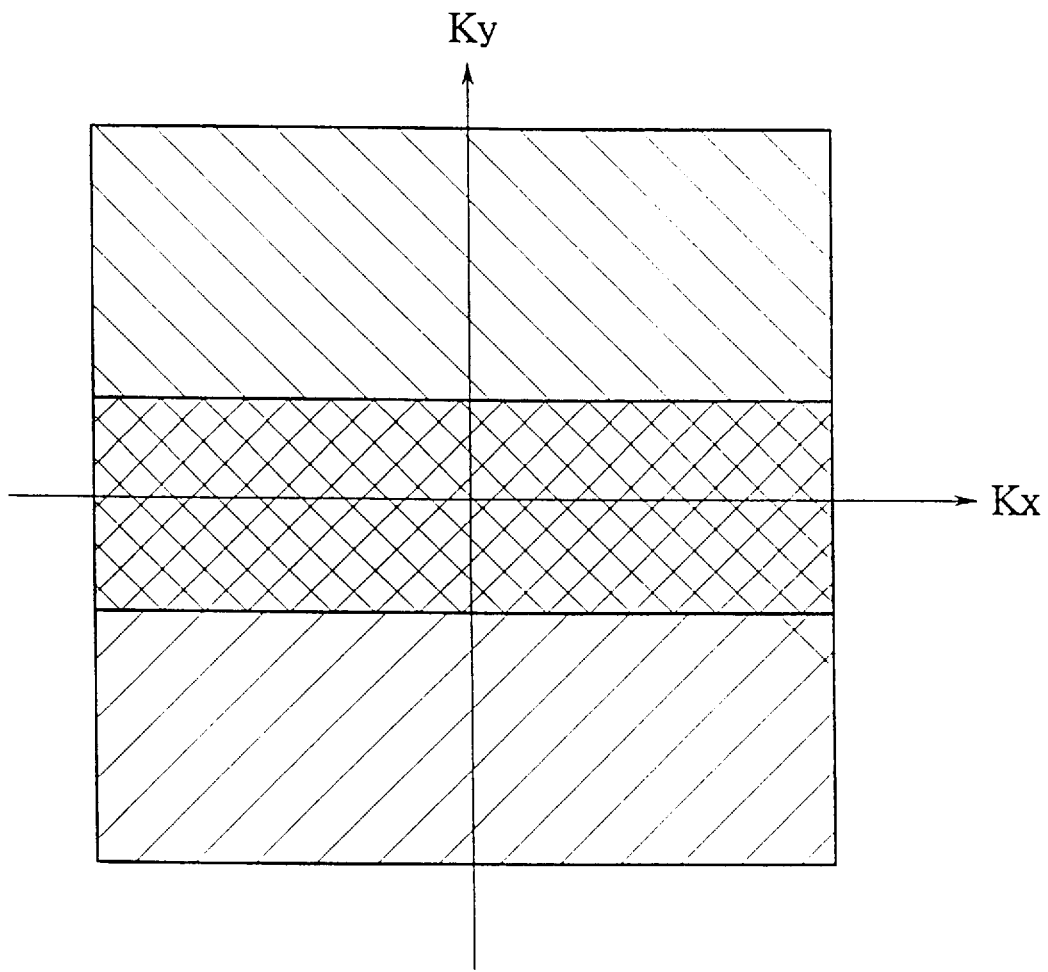
FIG. 29 illustrates how to acquire data on the "K" space for the modified example shown in FIG. 28.

FIG. 28 is a pulse sequence showing another modified example for the sixth embodiment. FIG. 29 illustrates how to acquire data on the "K" space for the modified example shown in FIG. 28. Referring to FIG. 28, the waveform for the phase encode gradient magnetic field is greatly rewound as indicated by Ge. Therefore, referring to FIG. 29, on the "K" space, its central portion is overlapped and two data are acquired before and after the spin echo. In this overlapped portion, average of the two data is taken or either of the two data are not utilized, and so on. In this technique, the data supplement utilizing the zero filling or the complex conjugate property of the acquired data can be omitted.

Many other modification and variations are possible. For example,. the multiple gradient echo used as a pair shown in FIG. 27 and FIG. 28 need not be applied before and after the spin echo. Instead, a multiple gradient echo before and after the 180° pulse may be used as a pair. Moreover, the multiple gradient echo need not be used in the FID signal portion.

In summary, according to the first embodiment of the present invention, the blood vessel image (angiographic image) and the brain image (cerebral image) are simultaneously obtained without extending an imaging duration, and the cortex portion and the vein portion can be easily distinguished.

According to the second embodiment, the vein portion is suppressed and the activated cortex portion can be easily clarified and distinguished from the vein portion.

According to the third embodiment in which the echo data are acquired in the position shifted by $\Delta t$ from the central portion of each spin echo generated by applied 180° pulse, the thus acquired echo data reflects $T_2^*$, so that the $T_2^*$-emphasized image can be easily obtained by reconstructing this $T_2^*$-reflected data.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method of obtaining a functional image of a human brain under medical examination by means of a magnetic resonance imaging apparatus, said method comprising:

applying a gradient field to said human brain located in a static field;

applying a 90° excitation pulse to said human brain while said gradient field is being applied thereto;

applying a 180° refocusing pulse to said human brain after the application of said gradient field and said excitation pulse;

applying a phase encoding pulse to said human brain:

acquiring a gradient echo signal induced in a slice of said human brain; and wherein said refocusing pulse applying step, said phase encoding pulse applying step, and said gradient echo signal acquiring step are repeated to obtain a sequence of gradient echo signals indicative of a T2* enhanced image, and wherein said gradient echo signal is acquired, between application of successive refocusing pulses, in a time distant from the center of a gradient echo for obtaining a T2* enhanced image and at the center of the gradient echo for obtaining a T2 enhanced Image.

2. The method of obtaining a functional image of a human brain as claimed in claim 1, wherein differential signals between said T2* enhanced image and said T2 enhanced image are obtained to indicate variation of T2*.

3. The method of obtaining a functional image of a human brain as claimed in claim 1, wherein said T2* enhanced image and said T2 enhanced image are obtained respectively under oppositely polarized gradient magnetic fields for reading.

4. The method of obtaining a functional image of a human brain as claimed in claim 1, wherein said T2* enhanced image and said T2 enhanced image are obtained respectively under gradient magnetic fields for reading having a same polarity with an oppositely polarized gradient magnetic field inbetween.

5. The method of obtaining a functional image of a human brain as claimed in claim 1, wherein said gradient echo signal is acquired in accordance with a multiple gradient echo technique in a time distant from the center of the gradient echo.

6. The method of obtaining a functional image of a human brain as claimed in claim 1, wherein said gradient echo signal is acquired by using an asymmetric encode.

7. The method of obtaining a functional image of a human brain as claimed in claim 1, wherein said gradient echo signal is acquired in accordance with a multiple gradient echo technique before and after the center of the gradient echo between application of successive refocusing pulses.

8. The method of obtaining a functional image of a human brain as claimed in claim 1, wherein said gradient echo signal is acquired by using an asymmetric encode in accordance with a multiple gradient echo technique before and after the center of the gradient echo between application of successive refocusing pulses.

9. The method of obtaining a functional image of a human brain as claimed in claim 5, wherein a number of phase encoding pulses having a same polarity are applied to said human brain with a phase encoding pulse having an opposite polarity to rewind phase encoding.

* * * * *